United States Patent
Yeom et al.

(10) Patent No.: US 11,862,632 B2
(45) Date of Patent: Jan. 2, 2024

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Kyong-Sik Yeom, Yongin-si (KR); Young Cheon Jeong, Hwaseong-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 310 days.

(21) Appl. No.: 17/236,362

(22) Filed: Apr. 21, 2021

(65) Prior Publication Data

US 2022/0059529 A1    Feb. 24, 2022

(30) Foreign Application Priority Data

Aug. 18, 2020  (KR) .................. 10-2020-0103022

(51) Int. Cl.
*H01L 27/088* (2006.01)
*H01L 29/423* (2006.01)
(Continued)

(52) U.S. Cl.
CPC .... *H01L 27/088* (2013.01); *H01L 21/823456* (2013.01); *H01L 21/823462* (2013.01); *H01L 21/823468* (2013.01); *H01L 29/40111* (2019.08); *H01L 29/42376* (2013.01); *H01L 29/4983* (2013.01); *H01L 29/516* (2013.01);
(Continued)

(58) Field of Classification Search
CPC ....... H01L 21/82385; H01L 21/823456; H01L 21/823864; H01L 21/823468; H01L 29/72376; H01L 29/6656; H01L 27/088; H01L 29/4983; H01L 29/78391; H01L 29/42376

See application file for complete search history.

(56) References Cited

U.S. PATENT DOCUMENTS 6,815,288 B2   11/2004  Kim
8,008,143 B2    8/2011  Hsu et al.
(Continued)

FOREIGN PATENT DOCUMENTS

KR        10-0372819       2/2003
KR     10-2010-0060217     6/2010
(Continued)

*Primary Examiner* — Jose R Diaz
(74) *Attorney, Agent, or Firm* — F. CHAU & ASSOCIATES, LLC

(57) ABSTRACT

A semiconductor device includes a first gate electrode structure having a first gate insulating layer on a substrate and a first gate electrode on the first gate insulating layer. A first spacer structure includes a first spacer and a second spacer on side walls of the first gate electrode structure. The first spacer is disposed between the second spacer and the first gate electrode. A source/drain region is disposed on opposite sides of the first gate electrode structure. The first gate electrode includes a lower part of the first gate electrode, an upper part of the first gate electrode disposed on the lower part of the first gate electrode, and the first spacer is disposed on the side wall of the upper pan of the first gate electrode and is not disposed on the side wall of the lower part of the first gate electrode.

17 Claims, 20 Drawing Sheets

(51) Int. Cl.

| | | |
|---|---|---|
| *H01L 29/49* | (2006.01) | |
| *H01L 29/51* | (2006.01) | |
| *H01L 29/78* | (2006.01) | |
| *H01L 29/66* | (2006.01) | |
| *H01L 21/8234* | (2006.01) | |
| *H01L 21/28* | (2006.01) | |

(52) U.S. Cl.
CPC ...... *H01L 29/6656* (2013.01); *H01L 29/6684* (2013.01); *H01L 29/78391* (2014.09)

(56) References Cited

U.S. PATENT DOCUMENTS

| | | | |
|---|---|---|---|
| 8,518,775 B2 | 8/2013 | Liu et al. | |
| 9,202,813 B2 | 12/2015 | Lee et al. | |
| 9,349,821 B2 | 5/2016 | Lee et al. | |
| 9,576,855 B2 | 2/2017 | Wu et al. | |
| 10,242,996 B2 | 3/2019 | Chen et al. | |
| 10,374,051 B1 | 8/2019 | Lin et al. | |
| 2008/0073733 A1* | 3/2008 | Kudo | H01L 29/4975 |
| | | | 257/E21.624 |
| 2011/0101469 A1* | 5/2011 | Kronholz | H01L 21/26586 |
| | | | 257/E21.409 |
| 2018/0350932 A1* | 12/2018 | Liu | H01L 21/32133 |

FOREIGN PATENT DOCUMENTS

| | | |
|---|---|---|
| KR | 10-2015-0132448 | 11/2015 |
| KR | 10-1617241 | 5/2016 |

* cited by examiner

SEMICONDUCTOR DEVICE AND METHOD OF FABRICATING THE SAME

CROSS-REFERENCE TO RELATED APPLICATION

This application claims the benefit of, and priority to, Korean Patent Application No. 10-2020-0103022, filed on Aug. 18, 2020, in the Korean Intellectual Property Office, the disclosure of which is herein incorporated by reference in its entirety.

TECHNICAL FIELD

The present disclosure relates to a semiconductor device, and more specifically, to a semiconductor device in which a polycrystalline semiconductor layer is included in a gate electrode, and a method of fabricating the same.

DISCUSSION OF THE RELATED ART

As a feature size of a MOS transistor decreases, a gate length and a length of a channel formed below the gate also decrease. Therefore, research is being performed to increase a capacitance between the gate and the channel and enhance the operating characteristics of the MOS transistor.

A silicon oxide layer that is mainly used as a gate insulating layer has been reduced in thickness and is close to reaching physical limits in electrical properties. Thus, the silicon oxide layer can no longer be made thinner while maintaining its desired physical properties. Therefore, in order to replace the conventional silicon oxide layer, research on a high-dielectric layer having a high-dielectric constant is being actively conducted. The high-dielectric layer may reduce a leakage current between the gate electrode and the channel region, while maintaining a thin equivalent oxide layer thickness.

Also, polysilicon, which is mainly used as a gate material, has a higher resistance than most metals. Therefore, the polysilicon gate electrode is replaced with a metal gate electrode or is replaced with a stacked layer structure which uses the polysilicon gate electrode and the metal gate electrode together.

SUMMARY

A semiconductor device includes a first gate electrode structure which includes a first gate insulating layer disposed on a substrate and a first gate electrode disposed on the first gate insulating layer. A first spacer structure which includes a first spacer and a second spacer is disposed on side walls of the first gate electrode structure. The first spacer is disposed between the second spacer and the first gate electrode. A source/drain region is disposed on both sides of the first gate electrode structure. The first gate electrode includes a lower part of the first gate electrode, an upper part of the first gate electrode disposed on the lower part of the first gate electrode, and the first spacer disposed on the side wall of the upper part of the first gate electrode. The first spacer is omitted from the side wall of the lower part of the first gate electrode.

A semiconductor device includes a first gate electrode structure disposed on a first region of a substrate and including a first gate insulating layer and a first gate electrode disposed on the first gate insulating layer. A first spacer is in contact with the first gate electrode, on side walls of the first gate electrode. A second gate electrode structure is disposed in a second region of the substrate and includes a second gate insulating layer and a second gate electrode disposed on the second gate insulating layer. A second spacer is in contact with the second gate electrode, on side walls of the second gate electrode. The first gate insulating layer includes a same material as the second gate insulating layer, and a height from an upper face of the first gate insulating layer to a lowermost part of the first spacer is greater than a height from an upper face of the second gate insulating layer to a lowermost part of the second spacer.

A semiconductor device includes a first gate electrode structure disposed on a first region of a substrate, and includes a first gate insulating layer, a first metallic gate electrode, and a first polysilicon electrode sequentially stacked on the substrate. A first spacer structure including a first spacer and a second spacer is disposed on side walls of the first gate electrode structure. The first spacer is disposed between the second spacer and the first polysilicon electrode and is spaced apart from an upper face of the first metallic gate electrode. A second gate electrode structure is disposed in a second region of the substrate, and includes a second gate insulating layer, a second metallic gate electrode, and a second polysilicon electrode sequentially stacked on the substrate. A second spacer structure includes a third spacer and a fourth spacer disposed on side walls of the second gate electrode structure. The third spacer is disposed between the fourth spacer and the second polysilicon electrode and is in contact with an upper face of the second metallic gate electrode. A height of the first gate electrode structure is greater than a height of the second gate electrode structure.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Figure 1:
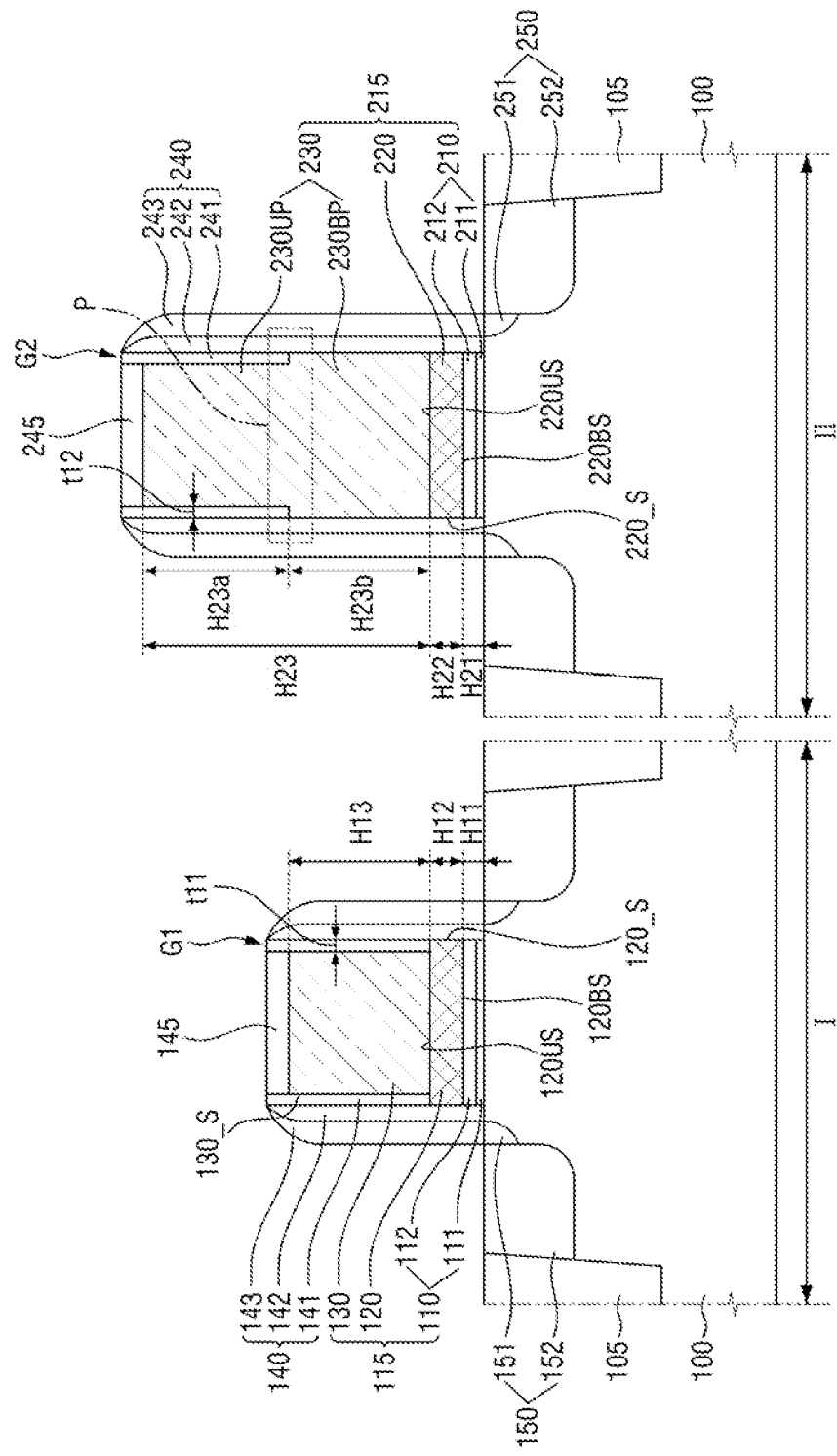
FIG. 1 is a diagram illustrating a semiconductor device according to embodiments of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 2:
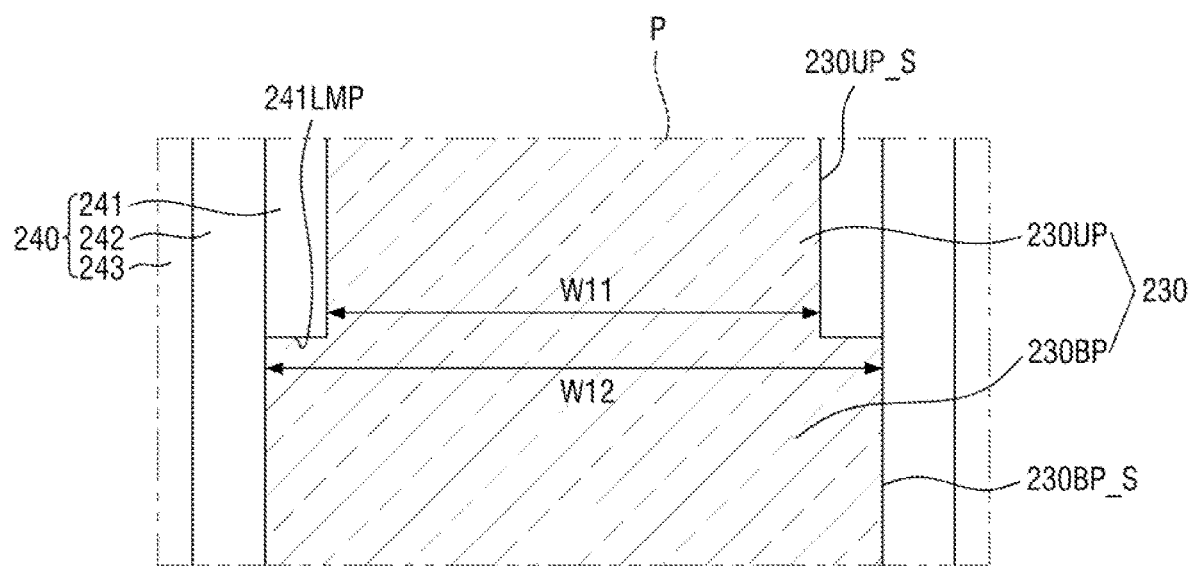
FIGS. 2 and 3 are enlarged views of a portion P of FIG. 1.
Figure 3:
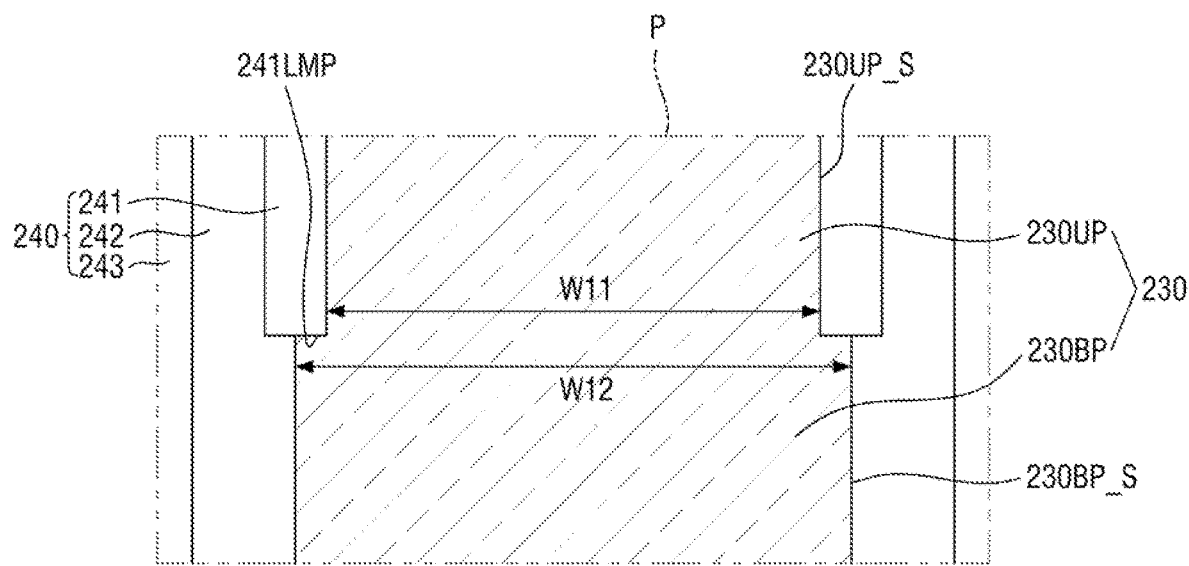

FIG. 1 is a diagram illustrating a semiconductor device according to embodiments of the present disclosure. FIGS. 2 and 3 are exemplary diagrams in which a portion P of FIG. 1 is enlarged, respectively.

Referring to FIGS. 1 to 3, the semiconductor device according to embodiments of the present disclosure may include a first gate electrode structure 115 and a second gate electrode structure 215.

The substrate 100 may include a first region I and a second region II. The first region I and the second region II may be regions spaced apart from each other or may be regions connected to each other.

For example, the first region I and the second region II may be high-voltage operating regions. For example, the first region I and the second region II may be low-voltage operating regions. For example, one of the first region I and the second region II may be a high-voltage operating region and the other one may be a low-voltage operating region.

For example, the first region I and the second region II may be PMOS formation regions. For example, either the first region I or the second region II may be PMOS formation regions. For example, one of the first region I and the second region II may be a PMOS formation region, and the other one may be an NMOS formation region.

The substrate 100 may be a silicon substrate or an SOI (silicon-on-insulator). The substrate 100 may include, but is not necessarily limited to including, silicon germanium, SGOI (silicon germanium on insulator), indium antimonide, lead tellurium compounds, indium arsenic, indium phosphide, gallium arsenide or gallium antimonide. In the following explanation, the substrate 100 will be explained as a silicon substrate.

An element isolation layer 105 may be disposed in the substrate 100. The element isolation layer 105 may define an active region. The element isolation layer 105 may be formed as a shallow trench isolation (STI) structure, which has excellent element isolation characteristics, occupies a small area, and thus is well suited for high integration.

The element isolation layer 105 may include, for example, at least one of silicon oxide, silicon nitride, silicon oxynitride, and a combination thereof. Although the element isolation layer 105 is shown as a single layer, this is only for convenience of explanation, and the embodiment is not necessarily limited thereto.

A first gate stack G1 may be disposed in the first region I of the substrate 100. The first gate stack G1 may include a first gate electrode structure 115, a first spacer structure 140, and a first gate mask pattern 145.

The first gate electrode structure 115 may include a first gate insulating layer 110, a first metallic gate electrode 120, and a first polycrystalline semiconductor electrode 130.

The first gate insulating layer 110 may be disposed on the substrate 100. The first gate insulating layer 110 may include a first interfacial layer 111 and a first high-dielectric constant insulating layer 112 sequentially disposed on the substrate 100.

The first interfacial layer 111 may be disposed between the substrate 100 and the first high-dielectric constant insulating layer 112. The first interfacial layer 111 may include, for example, but is not necessarily limited to including, a silicon oxide layer. The first interfacial layer 111 may vary depending on the material of the substrate 100 on which the first interfacial layer 111 is formed.

The first high-dielectric constant insulating layer 112 may include, for example, a high-dielectric constant material having a higher dielectric constant than silicon oxide. The high-dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first metallic gate electrode 120 may be disposed on the first gate insulating layer 110. The first metallic gate electrode 120 may include a lower face 120BS and an upper face 120US opposite to each other. The first metallic gate electrode 120 includes side walls 120_S which connect the lower face 120BS of the first metallic gate electrode 120 and the upper face 120US of the first metallic gate electrode 120. The lower face 120BS of the first metallic gate electrode 120 may face the first gate insulating layer 110.

According to some embodiments of the present disclosure, the first high-dielectric constant insulating layer 112 does not extend along the side walls 120_S of the first metallic gate electrode 120. For example, the first high-dielectric constant insulating layer 112 does not cover the side walls 120_S of the first metallic gate electrode 120.

The first metallic gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt) niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

The first polycrystalline semiconductor electrode 130 may be disposed on the first metallic gate electrode 120. According to some embodiments of the present disclosure, the first high-dielectric constant insulating layer 112 does not extend along the side walls 130_S of the first polycrystalline semiconductor electrode 130. For example, the first high-dielectric constant insulating layer 112 does not cover the side walls 130_S of the first polycrystalline semiconductor electrode 130.

The first polycrystalline semiconductor electrode 130 may include a polycrystalline semiconductor material, and may include, for example, but is not necessarily limited to including, polysilicon (poly-Si), polysilicon germanium (poly-SiGe), polysilicon doped with impurities, polysilicon germanium doped with impurities, and combinations thereof. In the semiconductor device according to embodiments of the present disclosure, the first polycrystalline semiconductor electrode 130 may include polysilicon or polysilicon doped with impurities. For example, the first polycrystalline semiconductor electrode 130 may be a polysilicon electrode.

The first gate mask pattern 145 may be disposed on the first gate electrode structure 115. The first gate mask pattern 145 may be disposed on the first polycrystalline semiconductor electrode 130.

The first gate mask pattern 145 may include an insulating material, and may include, for example, but is not necessarily limited to including, silicon oxide, silicon oxynitride, silicon nitride, or the like.

The first spacer structure 140 may be disposed on the side walls of the first gate electrode structure 115. The first gate mask pattern 145 may be disposed between the first spacer structures 140. The first spacer structure 140 covers at least a part of the side walls of the first gate mask pattern 145.

The first spacer structure 140 may include a first_1 spacer 141, a first_2 spacer 142, and a first_3 spacer 143 sequentially disposed on the side walls of the first gate electrode structure 115.

The first_1 spacer 141 may be disposed between the first gate electrode structure 115 and the first_2 spacer 142. The first_1 spacer 141 may be disposed on the side walls 130_S of the first polycrystalline semiconductor electrode 130. The first_1 spacer 141 extends along the entire side walls 130_S of the first polycrystalline semiconductor electrode 130.

The first_1 spacer 141 may be in contact with the first polycrystalline semiconductor electrode 130. The first_1 spacer 141 may extend to the upper face 120US of the first metallic gate electrode 120. The first_1 spacer 141 may be disposed on the upper face 120US of the first metallic gate electrode 120. The first_1 spacer 141 may be in contact with the upper face 120US of the first metallic gate electrode 120.

According to one example, the first_1 spacer 141 is not disposed on the side walls 120_S of the first metallic gate electrode 120 and the first_1 spacer 141 does not cover the side walls 120_S of the first metallic gate electrode 120.

A boundary between the first_1 spacer 141 and the first_2 spacer 142 may be aligned with the side walls 120_S of the first metallic gate electrode 120. For example, the first_1 spacer 141 may include an inner side wall facing the side walls 130_S of the first polycrystalline semiconductor electrode 130, and an outer side wall facing the first_2 spacer 142. The outer side wall of the first_1 spacer 141 may be aligned with the side walls 120_S of the first metallic gate electrode 120. For example, on the upper face 120US of the first metallic gate electrode 120, a width of the first metallic gate electrode 120 may be the same as widths of the first polycrystalline semiconductor electrode 130 and the first_1 spacer 141.

The first_2 spacer 142 may be disposed on the first_1 spacer 141. The first_2 spacer 142 may be disposed between the first_1 spacer 141 and the first_3 spacer 143.

The first_2 spacer 142 may extend along the side walls 130_S of the first polycrystalline semiconductor electrode 130 and the side walls 120_S of the first metallic gate electrode 120. The first_2 spacer 142 may cover the entire side walls of the first gate electrode structure 115. The first_2 spacer 142 may extend to the upper face of the substrate 100.

The first_3 spacer 143 may be disposed on the first_2 spacer 142. The first_3 spacer 143 may cover the entire side walls of the first gate electrode structure 115.

The first_1 spacer 141, the first_2 spacer 142 and the first_3 spacer 143 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN) and silicon oxycarbide (SiOC).

A first source/drain region 150 may be disposed on opposite sides of the first gate electrode structure 115. The first source/drain region 150 may be formed inside the substrate 100.

The first source/drain region 150 may include a first low-concentration impurity region 151 and a first high-concentration impurity region 152. The concentration of the dopant of the first high-concentration impurity region 152 is higher than the concentration of the dopant of the first low-concentration impurity region 151. In the semiconductor device according to embodiments of the present disclosure, a depth of the first high-concentration impurity region 152 may be deeper than a depth of the first low-concentration impurity region 151 with respect to the upper face of the substrate 100.

A second gate stack G2 may be disposed in the second region II of the substrate 100. The second gate stack G2 may include a second gate electrode structure 215, a second spacer structure 240, and a second gate mask pattern 245.

The second gate electrode structure 215 may include a second gate insulating layer 210, a second metallic gate electrode 220, and a second polycrystalline semiconductor electrode 230.

The second gate insulating layer 210 may be disposed on the substrate 100. The second gate insulating layer 210 may include a second interfacial layer 211 and a second high-dielectric constant insulating layer 212 sequentially disposed on the substrate 100.

The second interfacial layer 211 may be disposed between the substrate 100 and the second high-dielectric constant insulating layer 212. The second interfacial layer 211 may include, for example, but is not necessarily limited to including, a silicon oxide layer. The second interfacial layer 211 may vary depending on the material of the substrate 100 on which the second interfacial layer 211 is formed.

The second high-dielectric constant insulating layer 212 may include, for example, a high-dielectric constant material having a higher dielectric constant than silicon oxide. The second high-dielectric constant insulating layer 212 may include the same material as the first high-dielectric constant insulating layer 112.

The second metallic gate electrode 220 may be disposed on the second gate insulating layer 210. The second metallic gate electrode 220 may include a lower face 220BS and an upper face 220US opposite to each other. The second metallic gate electrode 220 includes side walls 220_S which connect the lower face 220BS of the second metallic gate electrode 220 and the upper face 220US of the second metallic gate electrode 220. The lower face 220BS of the second metallic gate electrode 220 may face the second gate insulating layer 210.

According to embodiment of the present disclosure, the second high-dielectric constant insulating layer 212 does not extend along the side walls 220_S of the second metallic gate electrode 220. For example, the second high-dielectric constant insulating layer 212 does not cover the side walls 220_S of the second metallic gate electrode 220.

For example, the second metallic gate electrode 220 may include the same material as the first metallic gate electrode 120.

The second polycrystalline semiconductor electrode 230 may be disposed on the second metallic gate electrode 220. The second polycrystalline semiconductor electrode 230 includes a lower part 230BP of the second polycrystalline semiconductor electrode 230, and an upper part 230UP of the second polycrystalline semiconductor electrode 230. The upper part 230UP of the second polycrystalline semiconductor electrode 230 is disposed on the lower part 230BP of the second polycrystalline semiconductor electrode 230. The lower part 230BP of the second polycrystalline semiconductor electrode 230 and the upper part 230UP of the second polycrystalline semiconductor electrode 230 may be divided by a second_1 spacer 241 to be explained below.

According to some embodiments of the present disclosure, the second high-dielectric constant insulating layer 212 does not extend along the side walls 230BP_S and 230UP_S of the second polycrystalline semiconductor electrode 230. For example, the second high-dielectric constant insulating layer 212 does not cover the side walls 230BP_S and 230UP_S of the second polycrystalline semiconductor electrode 230.

A lower side wall 230BP_S of the second polycrystalline semiconductor electrode 230 may be aligned with the side wall 220_S of the second metallic gate electrode 220. For example, the width of the upper face 220US of the second metallic gate electrode 220 may be the same as the width of the lower face of the second polycrystalline semiconductor electrode 230 facing the upper face 220US of the second metallic gate electrode 220.

The second polycrystalline semiconductor electrode 230 includes a polycrystalline semiconductor material, and may include, for example, but is not necessarily limited to, polysilicon (poly-Si), polysilicon germanium (poly-SiGe), polysilicon doped with impurities, polysilicon germanium doped with impurities, and combinations thereof. In the semiconductor device according to embodiments of the present disclosure, the second polycrystalline semiconductor electrode 230 may include polysilicon or polysilicon doped with impurities. For example, the second polycrystalline semiconductor electrode 230 may be a polysilicon electrode.

The second gate mask pattern 245 may be disposed on the second gate electrode structure 215. The second gate mask pattern 245 may be disposed on the second polycrystalline semiconductor electrode 230.

The second gate mask pattern 245 may include the same material as the first gate mask pattern 145.

The second spacer structure 240 may be disposed on the side walls of the second gate electrode structure 215. The second gate mask pattern 245 may be disposed between the second spacer structures 240. The second spacer structure 240 covers at least a part of the side walls of the second gate mask pattern 245.

The second spacer structure 240 may include a second_1 spacer 241, a second_2 spacer 242, and a second_3 spacer 243, which are sequentially disposed on the side walls of the second gate electrode structure 215.

The second spacer structure 240 may have the same stacked layer structure as the first spacer structure 140. The second_1 spacer 241 may correspond to the first_1 spacer 141. The second_2 spacer 242 may correspond to the first_2 spacer 142. The second_3 spacer 243 may correspond to the first_3 spacer 143.

The second_1 spacer 241 may be disposed between the second gate electrode structure 215 and the second_2 spacer 242. The second_1 spacer 241 may be disposed on the side walls of the second polycrystalline semiconductor electrode 230. The second_1 spacer 241 extends along a part of the side walls of the second polycrystalline semiconductor electrode 230.

The second_1 spacer 241 is disposed on the upper side wall 230UP_S of the second polycrystalline semiconductor electrode 230. According to some embodiments of the present disclosure, the second_1 spacer 241 is not disposed on the lower side wall 230BP_S of the second polycrystalline semiconductor electrode 230. According to some embodiments of the present disclosure, the second_1 spacer 241 covers the upper side wall 230UP_S of the second polycrystalline semiconductor electrode 230, but does not cover the lower side wall 230BP_S of the second polycrystalline semiconductor electrode 230.

The second_1 spacer 241 may be in contact with the second polycrystalline semiconductor electrode 230. The second_1 spacer 241 is in contact with the upper side wall 230UP_S of the second polycrystalline semiconductor electrode 230. According to some embodiments of the present disclosure, the second_1 spacer 241 is not in contact with the lower side wall 230BP_S of the second polycrystalline semiconductor electrode 230. The second_1 spacer 241 may be disposed on the upper face 220US of the second metallic gate electrode 220. According to some embodiments of the present disclosure, the second_1 spacer 241 does not extend to the upper face 220US of the second metallic gate electrode 220. According to some embodiments of the present disclosure, the second_1 spacer 241 is not in contact with the upper face 220US of the second metallic gate electrode 220.

According to some embodiments of the present disclosure, the second_1 spacer 241 is not disposed on the side walls 220_S of the second metallic gate electrode 220. According to some embodiments of the present disclosure, the second_1 spacer 241 does not cover the side walls 220_S of the second metallic gate electrode 220.

The second_2 spacer 242 may be disposed on the second_1 spacer 241. The second_2 spacer 242 may be disposed between the second_1 spacer 241 and the second_3 spacer 243.

The second_2 spacer 242 may extend along the upper side wall 230US_S of the second polycrystalline semiconductor electrode 230, the lower side wall 230BP_S of the second polycrystalline semiconductor electrode 230, and the side wall 220_S of the second metallic gate electrode 220. The second_2 spacer 242 may cover the entire side walls of the second gate electrode structure 215. The second_2 spacer 242 may extend to the upper face of the substrate 100.

The second_3 spacer 243 may be disposed on the second_2 spacer 242. The second_3 spacer 243 may cover the entire side walls of the second gate electrode structure 215.

The second_1 spacer 241 includes the same material as the first_1 spacer 141. The second_2 spacer 242 includes the same material as the first_2 spacer 142. The second_3 spacer 243 may include the same material as the first_3 spacer 143.

A second source/drain region 250 may be disposed on both sides of the second gate electrode structure 215. The second source/drain region 250 may be formed inside the substrate 100.

The second source/drain region 250 may include a second low-concentration impurity region 251 and a second high-concentration impurity region 252. The concentration of dopant of the second high-concentration impurity region 252 is higher than the concentration of dopant of the second low-concentration impurity region 251. In the semiconductor device according to embodiments of the present disclosure, the depth of the second high-concentration impurity region 252 may be deeper than the depth of the second low-concentration impurity region 251 with respect to the upper face of the substrate 100.

A height or a thickness (H21+H22+H23) of the second gate electrode structure 215 is greater than a height or a thickness (H11+H12+H13) of the first gate electrode structure 115. In the following explanation, the height of the first gate electrode structure 115 and the height of the second gate electrode structure 215 will be explained.

For example, a height H11 of the first gate insulating layer 110 may be the same as a height H21 of the second gate insulating layer 210. A height H12 of the first metallic gate electrode 120 may be the same as a height H22 of the second metallic gate electrode 220. A height H13 of the first polycrystalline semiconductor electrode 130 is smaller than a height H23 of the second polycrystalline semiconductor electrode 230. For example, a difference between the height of the first gate electrode structure 115 and the height of the second gate electrode structure 215 may be a difference between the height H13 of the first polycrystalline semiconductor electrode 130 and the height H23 of the second polycrystalline semiconductor electrode 230.

For example, the height H11 of the first gate insulating layer 110 may be different from the height H21 of the second gate insulating layer 210. The difference between the height of the first gate electrode structure 115 and the height of the second gate electrode structure 215 may be equal to the sum of the difference between the height H13 of the first polycrystalline semiconductor electrode 130 and the height H23 of the second polycrystalline semiconductor electrode 230, and the difference between the height H11 of the first gate insulating layer 110 and the height H21 of the second gate insulating layer 210. However, the difference between the height H13 of the first polycrystalline semiconductor electrode 130 and the height H23 of the second polycrystalline semiconductor electrode 230 may be much greater than the difference between the height H11 of the first gate insulating layer 110 and the height H21 of the second gate insulating layer 210. Therefore, the difference between the height of the first gate electrode structure 115 and the height of the second gate electrode structure 215 may be substantially the same as the difference between the height H13 of the first polycrystalline semiconductor electrode 130 and the height H23 of the second polycrystalline semiconductor electrode 230.

For example, the height H23 of the second polycrystalline semiconductor electrode 230 may be equal to the sum of a height H23a of the upper part 230UP of the second polycrystalline semiconductor electrode 230 and a height H23b of the lower part 230BP of the second polycrystalline semiconductor electrode 230. The height H23b of the lower part 230BP of the second polycrystalline semiconductor electrode 230 may be a height from the upper face 220US of the second metallic gate electrode 220 to the lowermost part 241LMP of the second_1 spacer.

For example, the height H12 from the upper face of the first gate insulating layer 110 to the lowermost part of the first_1 spacer 141 is smaller than a height (H22+H23b) from the upper face of the second gate insulating layer 210 to the lowermost part 241LMP of the second_1 spacer.

In the semiconductor device according to embodiments of the present disclosure, the height H23a of the upper part 230UP of the second polycrystalline semiconductor electrode 230 may be the same as the height 1113 of the first polycrystalline semiconductor electrode 130. The height H13 of the first polycrystalline semiconductor electrode 130 may be a height from the lowermost part of the first_1 spacer 141 to the upper face of the first polycrystalline semiconductor electrode 130. The height H23a of the upper part 230UP of the second polycrystalline semiconductor electrode 230 may be a height from the lowermost part 241LMP of the second_1 spacer to the upper face of the second polycrystalline semiconductor electrode 230.

In the semiconductor device according to embodiments of the present disclosure, a thickness t11 of the first_) spacer 141 on the side walls 130_S of the first polycrystalline semiconductor electrode 130 may be the same as a thickness t12 of the second_1 spacer 241 on the upper side wall 230UP_S of the second polycrystalline semiconductor electrode 230.

In the semiconductor device according to embodiments of the present disclosure, at the lowermost part 241LMP of the second_1 spacer 241, the width W11 of the upper part 230UP of the second polycrystalline semiconductor electrode 230 may be different from the width W12 of the lower part 230BP of the second polycrystalline semiconductor. For example, the width W12 of the lower part 230BP of the second polycrystalline semiconductor electrode 230 may be greater than the width W11 of the upper part 230UP of the second polycrystalline semiconductor electrode 230.

In FIG. 2, the lowermost part 241LMP of the second_1 spacer 241 may entirely extend over the lower part 230BP of the second polycrystalline semiconductor electrode 230. The boundary between the second_1 spacer 241 and the second_2 spacer 242 may be aligned with the lower side wall 230BP_S of the second polycrystalline semiconductor electrode 230.

In FIG. 3, a part of the lowermost part 241LMP of the second_1 spacer may extend over the lower part 230BP of the second polycrystalline semiconductor electrode 230. According to some embodiments of the present disclosure, the boundary between the second_1 spacer 241 and the second_2 spacer 242 is not aligned with the lower side wall 230BP_S of the second polycrystalline semiconductor electrode 230.

The semiconductor device according to embodiments of the present disclosure may include an NC (Negative Capacitance) FET using a negative capacitor. For example, the first high-dielectric constant insulating layer 112 and the second high-dielectric constant insulating layer 212 may include a ferroelectric material layer having ferroelectric properties and a paraelectric material layer having paraelectric properties.

The ferroelectric material layer may have a negative capacitance, and the paraelectric material layer may have a positive capacitance. For example, if two or more capacitors are connected in series and the capacitance of each capacitor has a positive value, the total capacitance becomes decrease compared to the capacitance of each individual capacitor. On the other hand, if at least one of the capacitances of the two or more capacitors connected in series has a negative value, the total capacitance may be greater than an absolute value of each individual capacitance, while having a positive value.

When the ferroelectric material layer having the negative capacitance and the paraelectric material layer having the positive capacitance are connected in series, the entire capacitance values of the ferroelectric material layer and the paraelectric material layer connected in series may increase. Taking advantage of the increased overall capacitance value, a transistor including the ferroelectric material layer may have a subthreshold swing (SS) of less than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide and lead zirconium titanium oxide. Here, for example, the hafnium zirconium oxide may be a material obtained by doping hafnium oxide with zirconium (Zr). For example, the hafnium zirconium oxide may also be a compound of hafnium (H), zirconium (Zr) and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). The type of dopant included in the ferroelectric material layer may vary depending on the ferroelectric material included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al) and yttrium (Y).

When the dopant is aluminum (Al), the ferroelectric material layer may contain 3 to 8 at % (atomic %) aluminum. Here, the ratio of the dopant may be a ratio of aluminum to the sum of hafnium and aluminum.

When the dopant is silicon (Si), the ferroelectric material layer may contain 2 to 10 at % silicon. When the dopant is yttrium (Y), the ferroelectric material layer may contain 2 to 10 at % yttrium. When the dopant is gadolinium (Gd), the ferroelectric material layer may contain 1 to 7 at % gadolinium. When the dopant is zirconium (Zr), the ferroelectric material layer may contain 50 to 80 at % zirconium.

The paraelectric material layer may have paraelectric properties. The paraelectric material layer may include, for example, at least one of silicon oxide and a metal oxide having a high-dielectric constant. The metal oxide included in the paraelectric material layer may include, for example, but is not necessarily limited to, at least one of hafnium oxide, zirconium oxide and aluminum oxide.

The ferroelectric material layer and the paraelectric material layer may include the same material. Although the ferroelectric material layer has ferroelectric properties, the paraelectric material layer might not have the ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness with ferroelectric properties. The thickness of the ferroelectric material layer may be, for example, but is not necessarily limited to, 0.5 to 10 nm. Since each ferroelectric material may have a different critical thickness that exhibits the ferroelectric properties, the thickness of the ferroelectric material layer may vary depending on the ferroelectric material.

For example, the gate insulating layer may include one ferroelectric material layer. For example, the gate insulating layer may include a plurality of ferroelectric material layers separated from each other. The gate insulating layer may have a stacked layer structure in which a plurality of ferroelectric material layers and a plurality of paraelectric material layers are alternately stacked.

Figure 4:
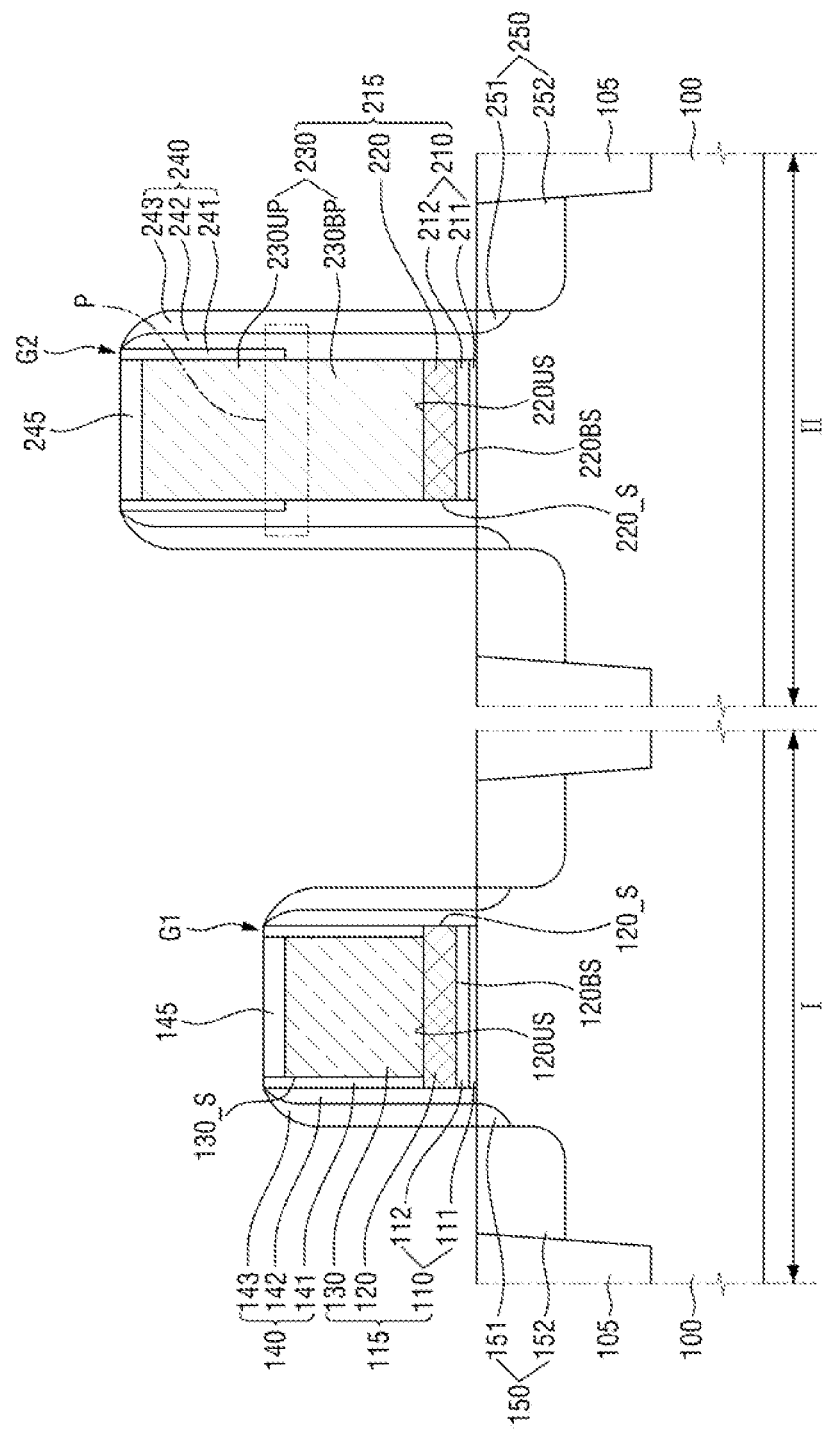
FIG. 4 is a diagram illustrating a semiconductor device according to embodiments of the present disclosure.
Figure 5:
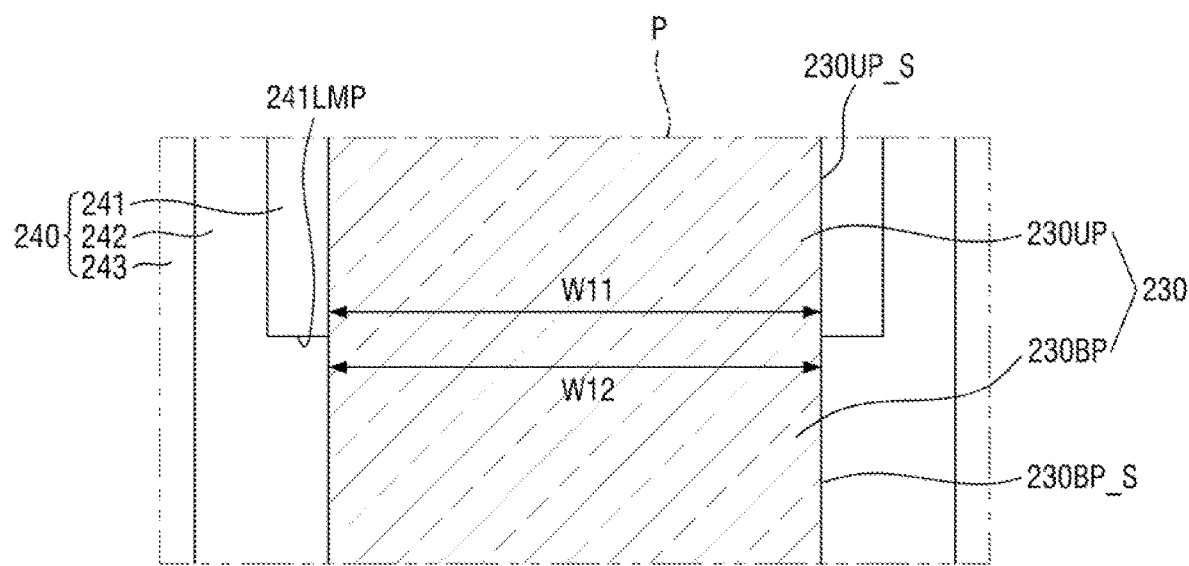
FIG. 5 is an enlarged view of a portion P of FIG. 4.

FIG. 4 is a diagram illustrating the semiconductor device according to embodiments of the present disclosure. FIG. 5 is an enlarged view of a portion P of FIG. 4. For convenience of explanation, differences from contents explained using FIGS. 1 to 3 will be mainly described.

Referring to FIGS. 4 and 5, in the semiconductor device according to embodiments of the present disclosure, at the lowermost part 241LMP of the second_1 spacer, the width W11 of the upper part 230UP of the second polycrystalline semiconductor electrode 230 may be the same as the width W12 of the lower part 230BP of the second polycrystalline semiconductor electrode 230.

According to some embodiments of the present disclosure, the lowermost part 241LMP of the second_1 spacer 241 does not entirely extend over the lower part 230 BP of the second polycrystalline semiconductor electrode 230. The lowermost part 241LMP of the second_1 spacer may entirely extend over the second_2 spacer 242.

The lower side wall 230BP_S of the second polycrystalline semiconductor electrode 230 may be aligned with the upper side wall 230UP_S of the second polycrystalline semiconductor electrode 230.

Figure 6:
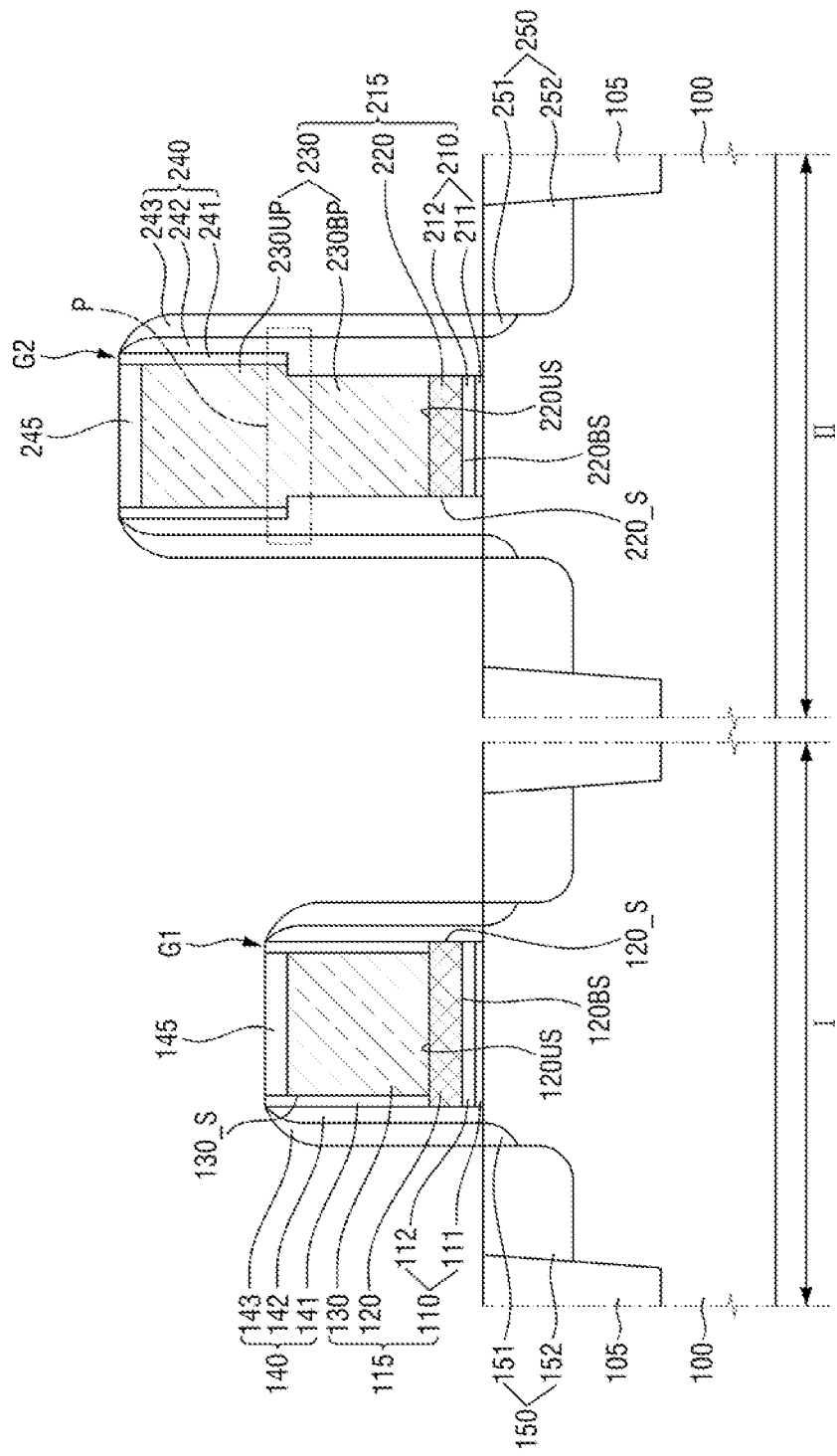
FIG. 6 is a diagram illustrating a semiconductor device according to embodiments of the present disclosure.
Figure 7:
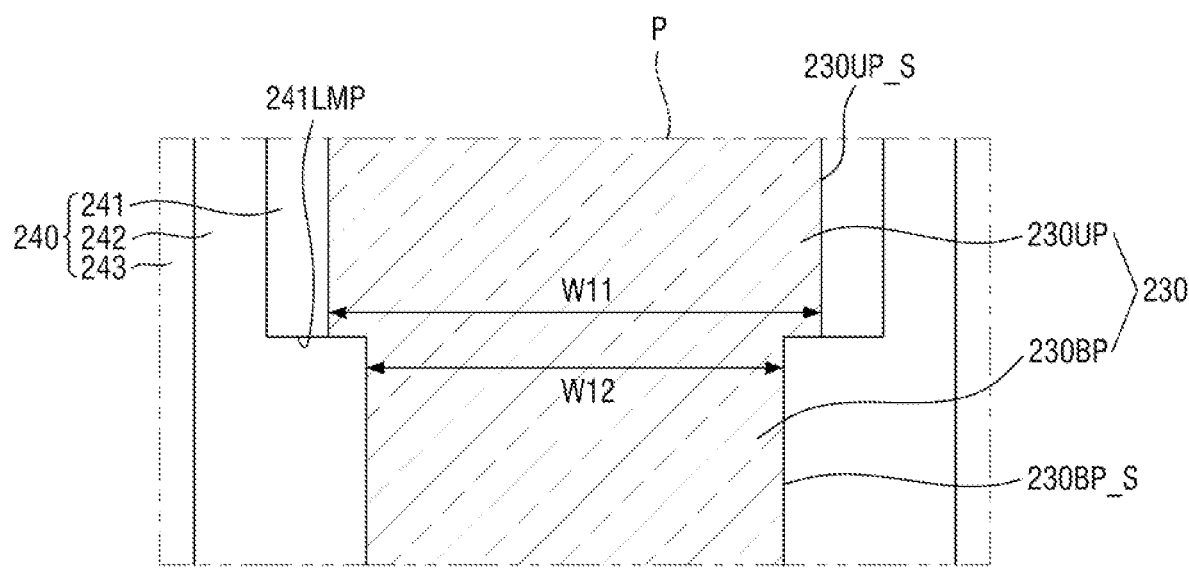
FIG. 7 is an enlarged view of a portion P of FIG. 6.

FIG. 6 is a diagram illustrating the semiconductor device according to embodiments of the present disclosure. FIG. 7 is an enlarged view of a portion P of FIG. 6. For convenience of explanation, differences from contents explained using FIGS. 1 to 3 will be mainly described.

Referring to FIGS. 6 and 7, in the semiconductor device according to embodiments of the present disclosure, at the lowermost part 241LMP of the second_1 spacer 241, the width W11 of the upper part 230UP of the second polycrystalline semiconductor electrode 230 may be greater than the width W12 of the lower part 230BP of the second polycrystalline semiconductor electrode 230.

A part of the upper part 230UP of the second polycrystalline semiconductor electrode 230 may extend over the second_2 spacer 242.

According to some embodiments of the present disclosure, the lower side wall 230BP_S of the second polycrystalline semiconductor electrode 230 is not aligned with the upper side wall 230UP_S of the second polycrystalline semiconductor electrode 230.

Figure 8:
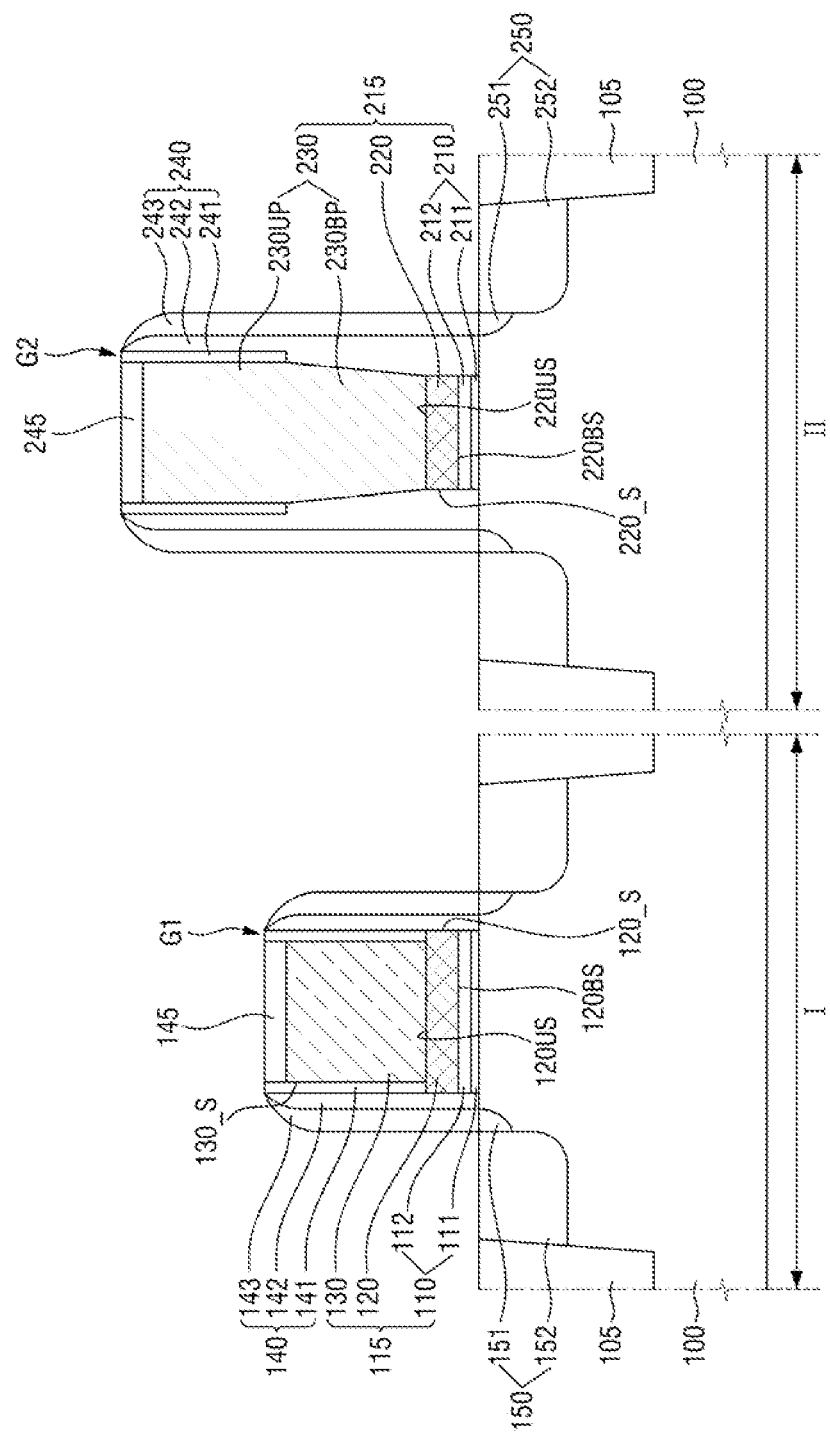
FIG. 8 is a diagram illustrating a semiconductor device according to embodiments of the present disclosure.
Figure 9:
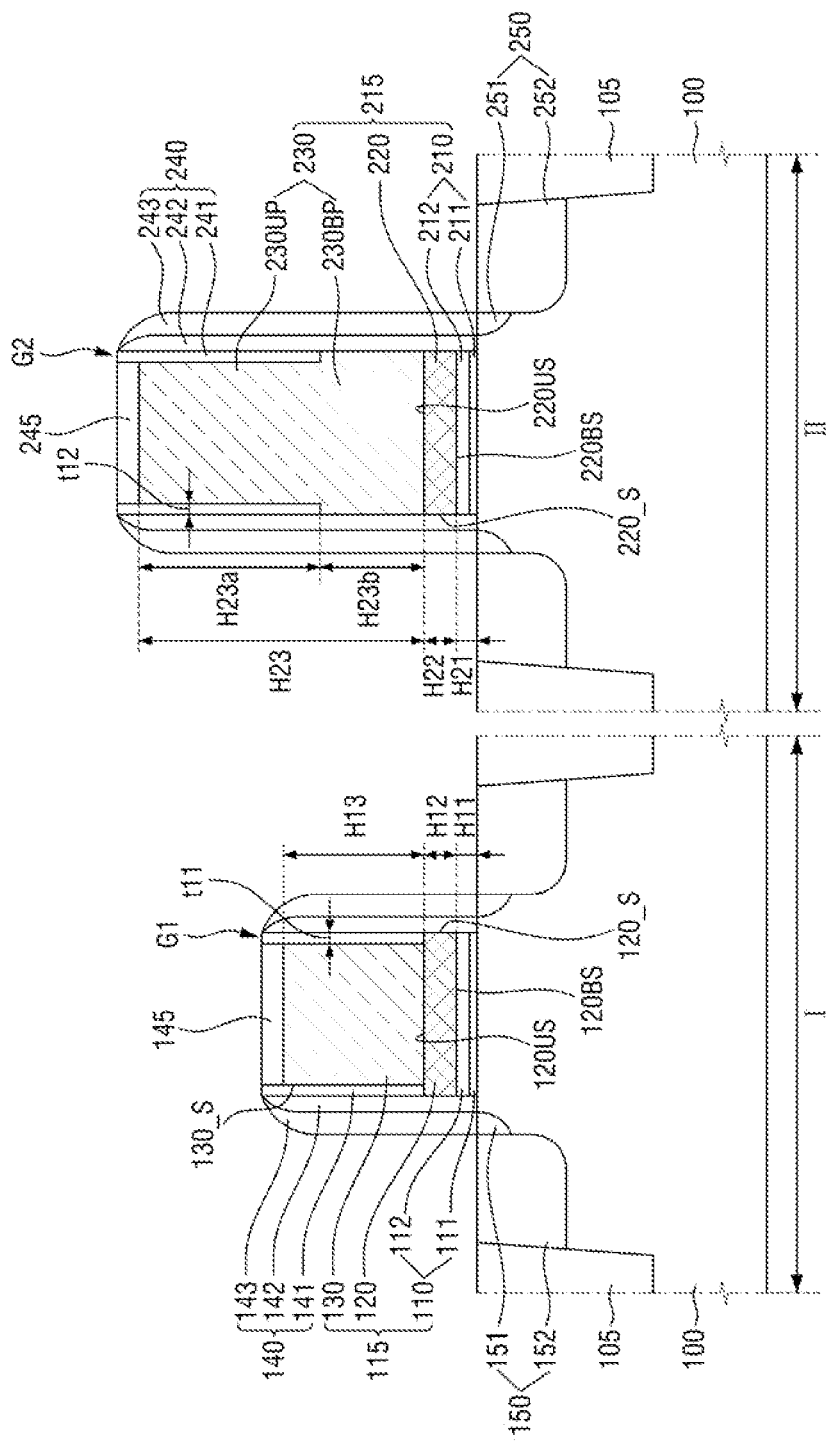
FIG. 9 is a diagram illustrating a semiconductor device according to embodiments of the present disclosure.

FIG. 8 is a diagram illustrating the semiconductor device according to embodiments of the present disclosure. FIG. 9 is a diagram illustrating the semiconductor device according to embodiments of the present disclosure. For convenience of explanation, differences from contents explained using FIGS. 1 to 3 will be mainly described.

Referring to FIG. 8, in the semiconductor device according to embodiments of the present disclosure, the width of the lower face of the second polycrystalline semiconductor electrode 230 facing the upper face 220US of the second metallic gate electrode 220 may differ from the width of the lower part 230BP of the second polycrystalline semiconductor electrode 230 at the lowermost part of the second_1 spacer 241.

For example, as it goes away from the upper face 220US of the second metallic gate electrode 220, the width of the lower part 230BP of the second polycrystalline semiconductor electrode 230 may increase. The width of the upper face 220US of the second metallic gate electrode 220 may be the same as the width of the lower face of the second polycrystalline semiconductor electrode 230 facing the upper face 220US of the second metallic gate electrode 220.

Referring to FIG. 9, in the semiconductor device according to embodiments of the present disclosure, a height H23a of the upper part 230UP of the second polycrystalline semiconductor electrode 230 is greater than the height H13 of the first polycrystalline semiconductor electrode 130.

The height H13 from the lowermost part of the first_1 spacer 141 to the upper face of the first polycrystalline semiconductor electrode 130 is smaller than the height H23a from the lowermost part of the second_1 spacer 241 to the upper face of the second polycrystalline semiconductor electrode 230.

Figure 10:
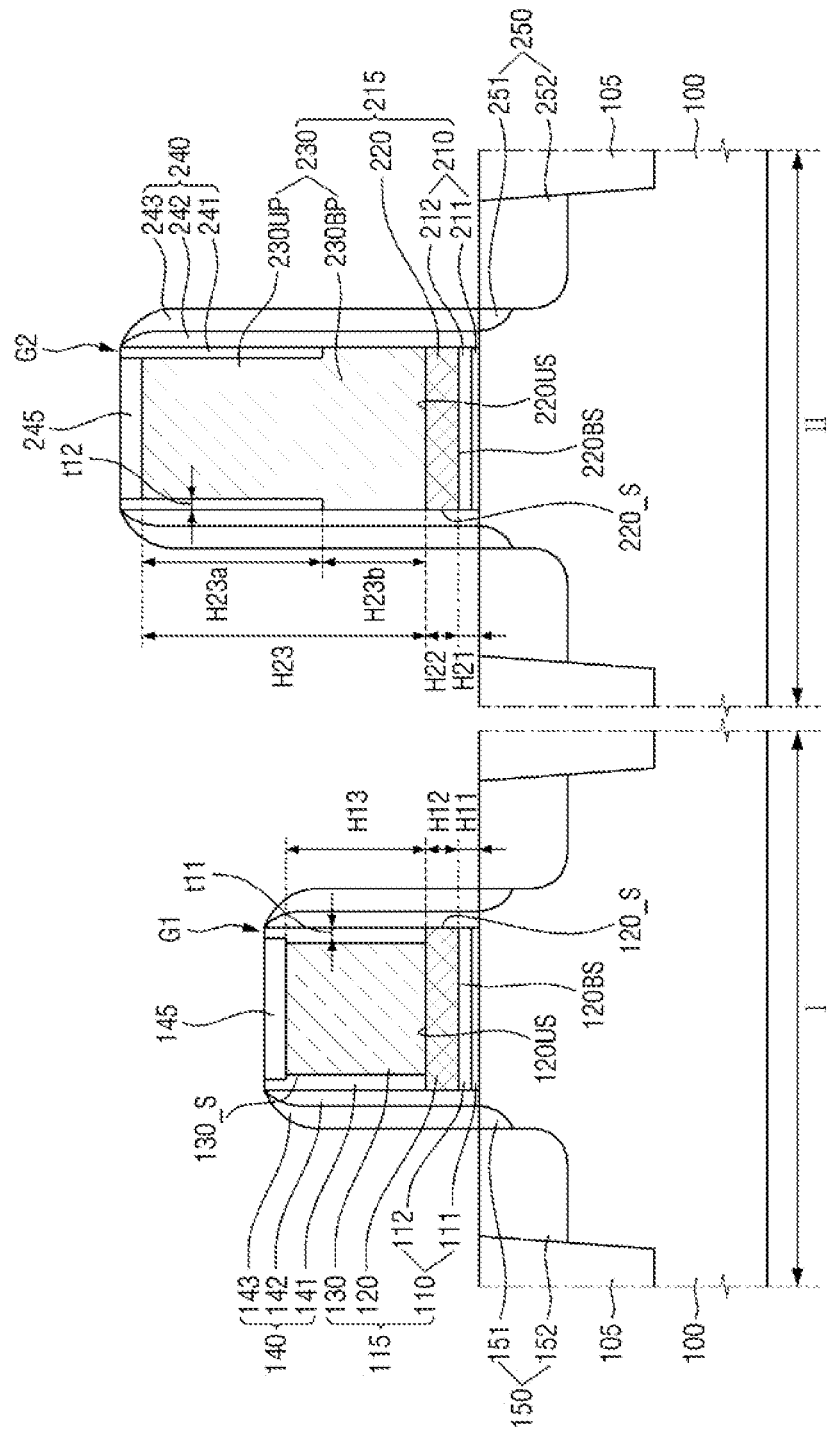
FIG. 10 is a diagram illustrating a semiconductor device according to embodiments of the present disclosure.

FIG. 10 is a diagram illustrating the semiconductor device according to embodiments of the present disclosure. For convenience of explanation, differences from contents explained using FIG. 9 will be mainly described.

Referring to FIG. 10, in the semiconductor device according to embodiments of the present disclosure, the thickness t11 of the first_1 spacer 141 on the side walls 130_S of the first polycrystalline semiconductor electrode 130 is greater than the thickness t12 of the second_1 spacer 241 on the upper side wall 230UP_S of the second polycrystalline semiconductor electrode 230.

At the boundary between the first polycrystalline semiconductor electrode 130 and the first gate mask pattern 145, the width of the first polycrystalline semiconductor electrode 130 may be smaller than the width of the first gate mask pattern 145.

Figure 11:
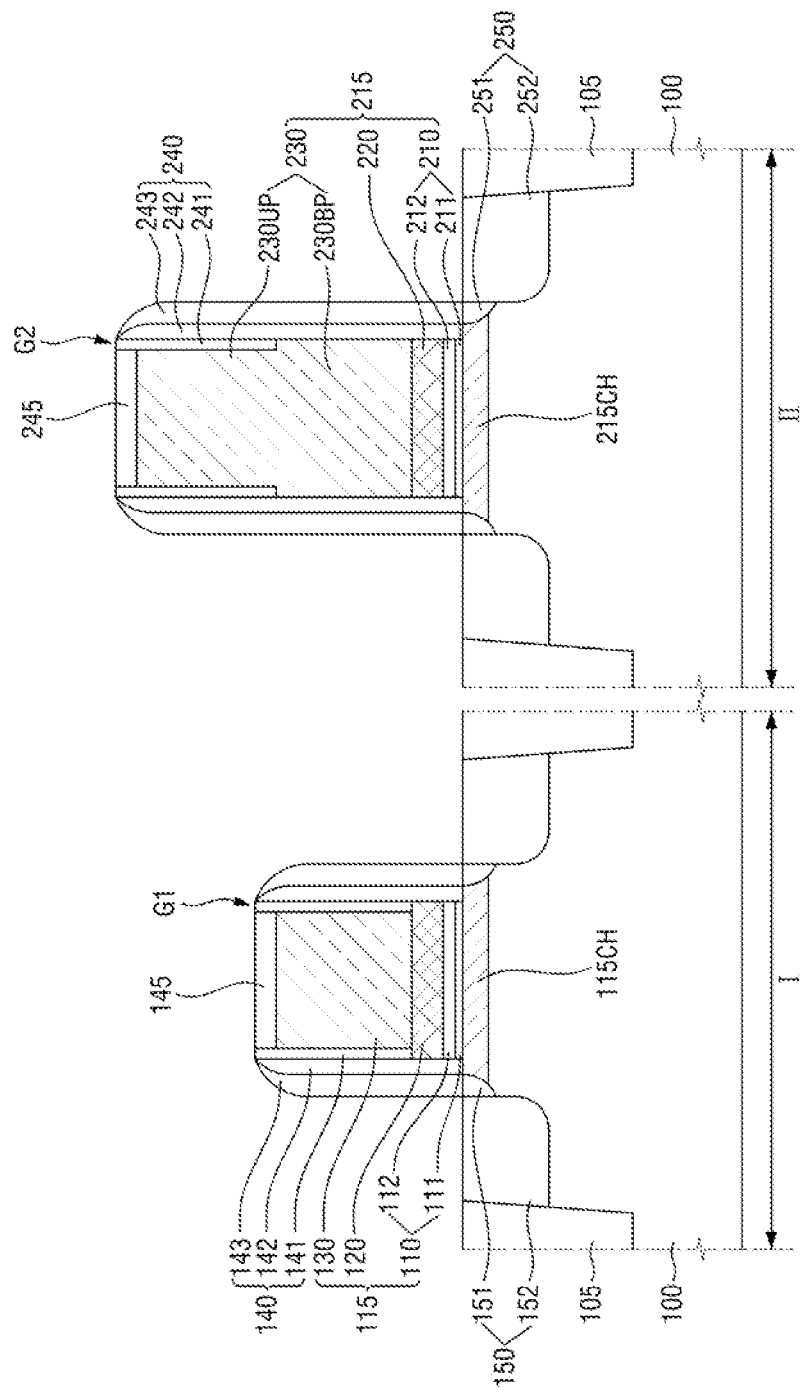
FIG. 11 is a diagram illustrating a semiconductor device according to embodiments of the present disclosure.
Figure 12:
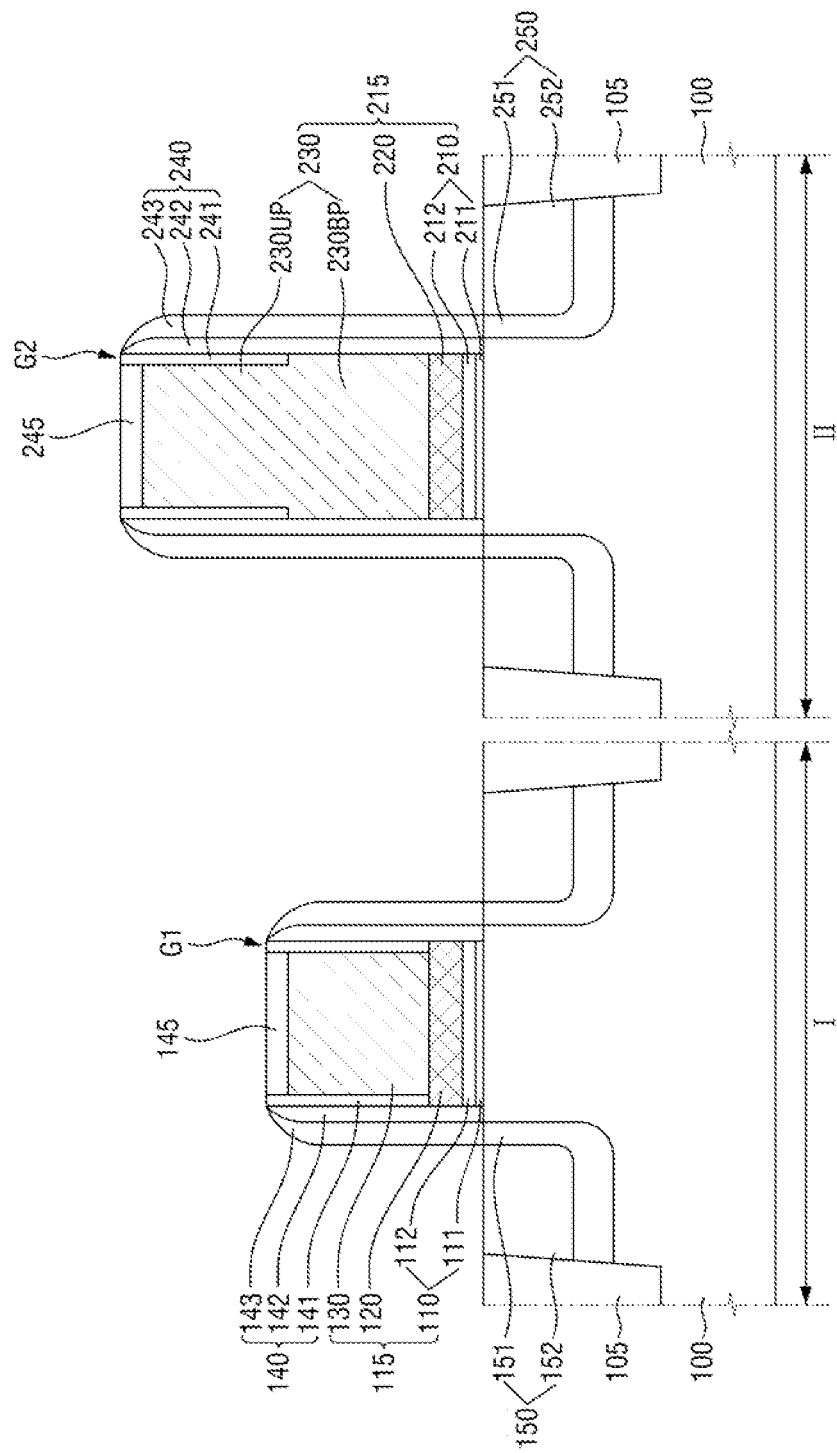
FIG. 12 is a diagram illustrating a semiconductor device according to embodiments of the present disclosure.
Figure 13:
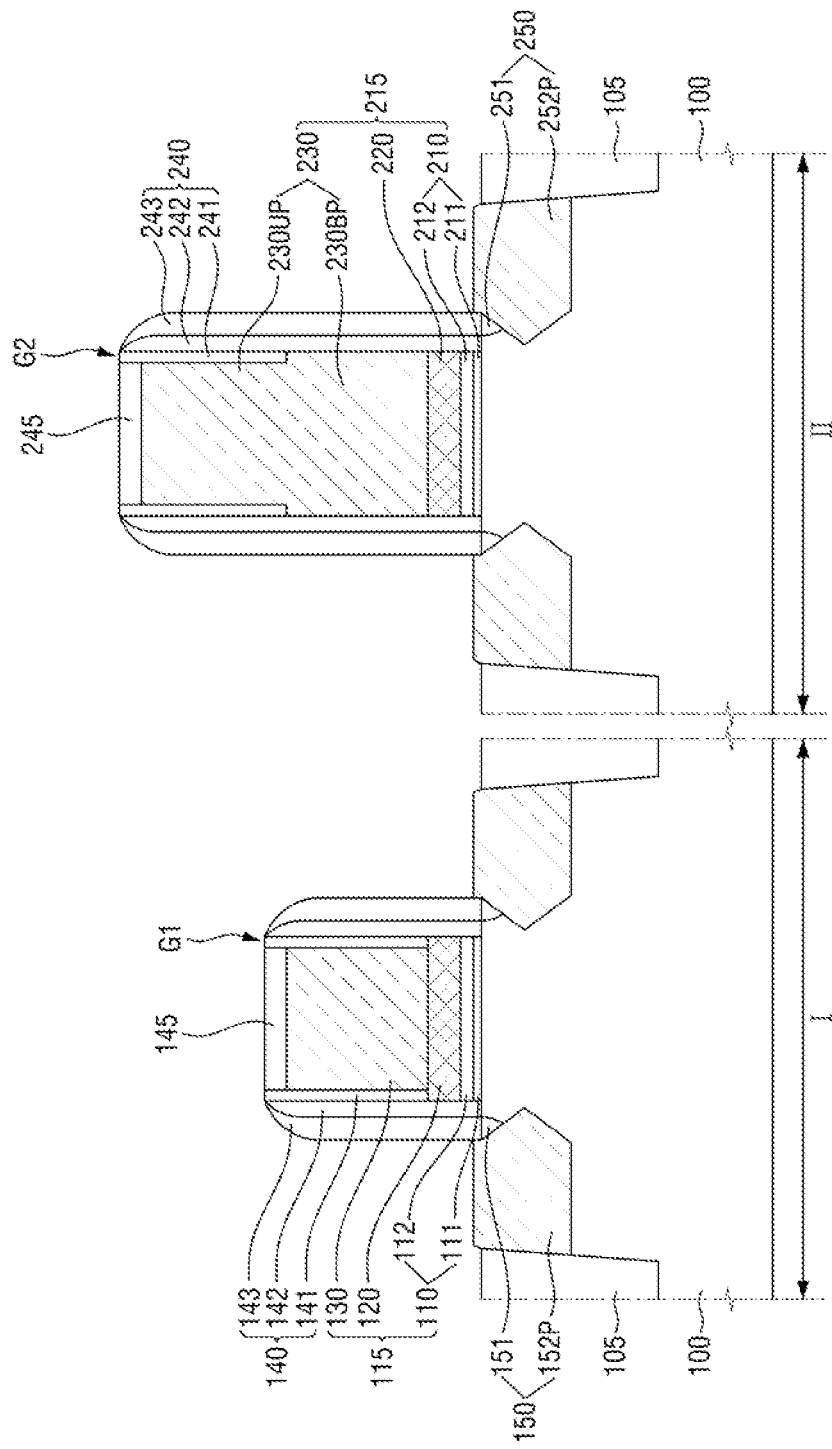
FIG. 13 is a diagram illustrating a semiconductor device according to embodiments of the present disclosure.

FIG. 11 is a diagram illustrating the semiconductor device according to embodiments of the present disclosure. FIG. 12 is a diagram illustrating the semiconductor device according to embodiments of the present disclosure. FIG. 13 is a diagram illustrating the semiconductor device according to embodiments of the present disclosure. For convenience of explanation, differences from contents explained using FIGS. 1 to 3 will be mainly described.

Referring to FIG. 11, the semiconductor devices according to embodiments of the present disclosure may further include a first semiconductor channel layer 115CH disposed in the first region I and a second semiconductor channel layer 215CH disposed in the second region II.

The first semiconductor channel layer 115CH may be disposed below the first gate insulating layer 110. The second semiconductor channel layer 215CH may be disposed below the second gate insulating layer 210.

The first semiconductor channel layer 115CH and the second semiconductor channel layer 215CH may include, for example, a material having a lattice constant greater than the substrate 100. For example, when the substrate 100 is a silicon substrate, the first semiconductor channel layer 115CH and the second semiconductor channel layer 215CH may each include a silicon germanium layer.

For example, the first region I and the second region II may be regions in which the PMOS is formed.

Unlike the shown case, the first semiconductor channel layer 115CH and the second semiconductor channel layer 215CH may extend to the element isolation layer 105. A part of the first source/drain region 150 may be formed inside the first semiconductor channel layer 115CH. The second source/drain region 250 may be formed inside the second semiconductor channel layer 215CH.

Unlike the shown case, for example, the first semiconductor channel layer 115CH may be disposed in the first region I, and the second semiconductor channel layer 215CH might not be disposed in the second region II. At this time, the second region II may be a region in which the PMOS is formed or a region in which the NMOS is formed.

Unlike the shown case, for example, the second semiconductor channel layer 215CH may be disposed in the second region II, and the first semiconductor channel layer 115CH might not be formed in the first region I. At this time, the first region I may be a region in which the PMOS is formed or a region in which the NMOS is formed.

Referring to FIG. 12, in the semiconductor device according to embodiments of the present disclosure, the depth of the first high-concentration impurity region 152 may be shallower than the depth of the first low-concentration impurity region 151 with respect to the upper face of the substrate 100. For example, the first high-concentration impurity region 152 may be formed in the first low-concentration impurity region 151.

The depth of the second high-concentration impurity region 252 may be shallower than the depth of the second low-concentration impurity region 251 with respect to the upper face of the substrate 100. For example, the second high-concentration impurity region 252 may be formed in the second low-concentration impurity region 251.

Unlike the shown case, for example, in the second source/drain region 250, as FIG. 1, the depth of the second high-concentration impurity region 252 may be deeper than the depth of the second low-concentration impurity region 251. For example, in the first source/drain region 150, as in FIG. 1, the depth of the first high-concentration impurity region 152 may be deeper than the depth of the first low-concentration impurity region 151.

Referring to FIG. 13, in the semiconductor device according to embodiments of the present disclosure, the first source/drain region 150 may include a first epitaxial semiconductor pattern 152P, and the second source/drain region 250 may include a second epitaxial semiconductor pattern 252P.

The first epitaxial semiconductor pattern 152P and the second epitaxial semiconductor pattern 252P may be formed to fill a recess formed in the substrate 100, respectively.

When the first region I and the second region are NMOS formation regions, each of the first epitaxial semiconductor pattern 152P and the second epitaxial semiconductor pattern 252P may be the same materials as the substrate 100 or a tensile stress material. For example, when the substrate 100 is silicon, each of the first epitaxial semiconductor pattern 152P and the second epitaxial semiconductor pattern 252P may be silicon or a material (for example, silicon carbide) having a lattice constant smaller than silicon.

When the first region I and the second region are PMOS formation regions, each of the first epitaxial semiconductor pattern 152P and the second epitaxial semiconductor pattern 252P may include the substrate 100 and a compressive stress material. For example, the compressive stress material may be a material having a lattice constant greater than Si, for example, SiGe.

When one of the first region I and the second region II is a PMOS formation region, and the other one is an NMOS formation region, the first epitaxial semiconductor pattern 152P and the second epitaxial semiconductor pattern 252P may include materials different from each other.

Unlike the shown case, the epitaxial semiconductor pattern described above might not be formed in one of the first region I or the second region II.

FIGS. 14 to 20 are diagrams illustrating intermediate steps in a method of fabricating a semiconductor device according to embodiments of the present disclosure.

Figure 14:
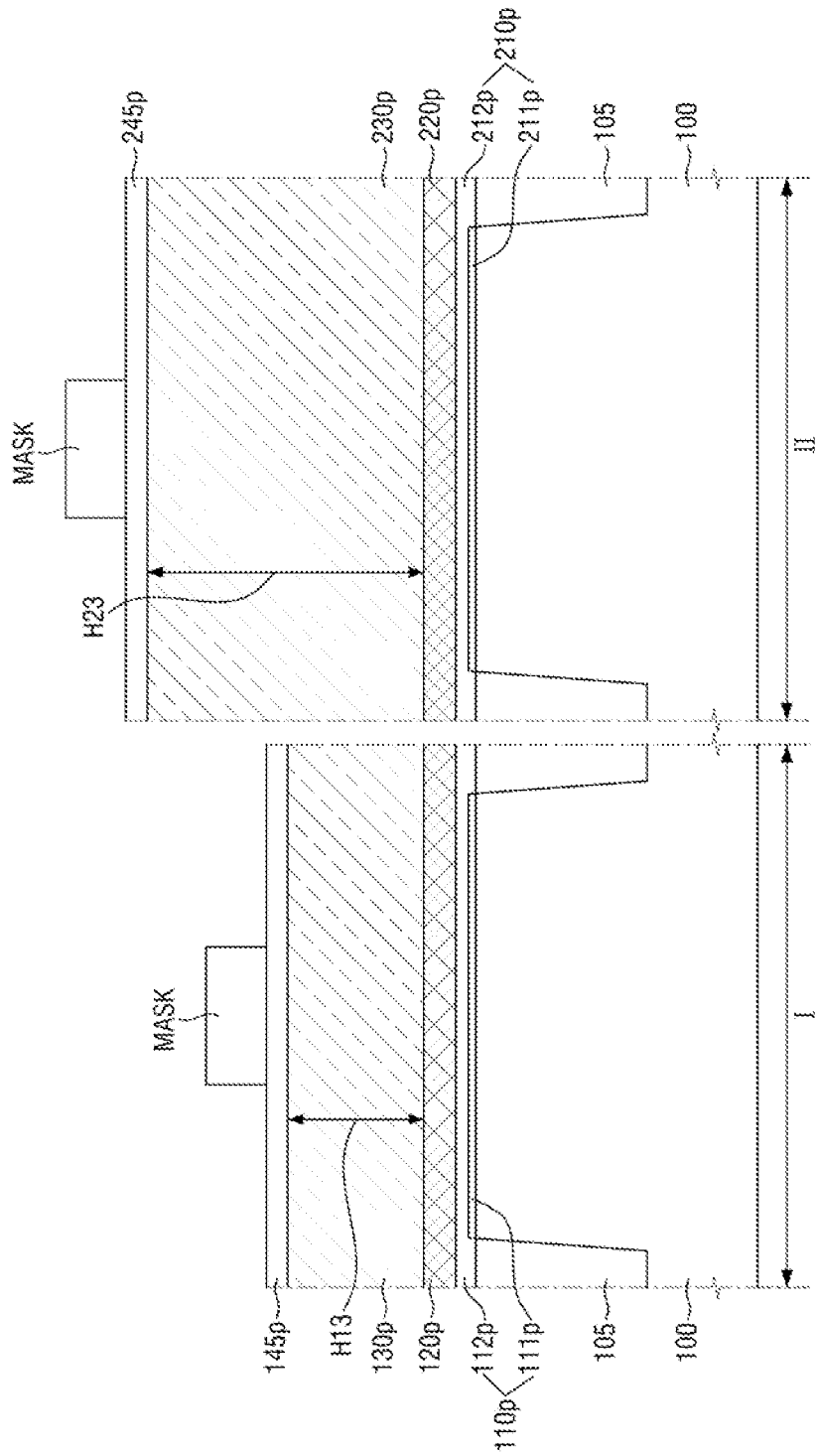
FIGS. 14 to 20 are diagrams illustrating intermediate steps of a method of fabricating a semiconductor device according to embodiments of the present disclosure.

Referring to FIG. 14, a first pre gate insulating layer 110p and a first pre metallic gate electrode 120p may be sequentially formed on the substrate 100 of the first region I.

A second pre gate insulating layer 210p and a second pre metallic gate electrode 220p may be sequentially formed on the substrate 100 of the second region II.

The first pre gate insulating layer 110p may include a first pre interfacial layer 111p and a first pre high-dielectric constant insulating layer 112p. The second pre gate insulating layer 210p may include a second pre interfacial layer 211p and a second pre high-dielectric constant insulating layer 212p.

Although the first pre interfacial layer 111p and the second pre interfacial layer 211p are shown as not being formed on the upper face of the element isolation layer 105, the present disclosure is not necessarily limited thereto. Depending on the method of forming the first pre interfacial layer 111p and the second pre interfacial layer 211p, the first pre interfacial layer 111p and/or the second pre interfacial layer 211p may extend along the upper face of the element isolation layer 105p.

The first pre high-dielectric constant insulating layer 112p and the second pre high-dielectric constant insulating layer 212p may be formed at the same level. Here, the term "same level" means that the insulating layers are formed by the same fabricating process. A pre high-dielectric constant insulating layer including the first pre high-dielectric constant insulating layer 112p and the second pre high-dielectric constant insulating layer 212p is formed in the first region I and the second region II of the substrate 100.

The first pre high-dielectric constant insulating layer 112p and the second pre high-dielectric constant insulating layer 212p may include the same material. The thickness of the first pre high-dielectric constant insulating layer 112p on the first pre interfacial layer 111p may be equal to the thickness of the second pre high-dielectric constant insulating layer 212p on the second pre interfacial layer 211p.

The first pre metallic gate electrode 120p may be formed at the same level as the second pre metallic gate electrode 220p. A pre metallic gate electrode including the first pre metallic gate electrode 120p and the second pre metallic gate electrode 220p are formed in the first region I and the second region II of the substrate 100.

Subsequently, a first pre polycrystalline semiconductor layer 130p may be formed on the first pre metallic gate electrode 120p. The first pre polycrystalline semiconductor layer 130p may have a first height H13.

A second pre polycrystalline semiconductor layer 230p may be formed on the second pre metallic gate electrode 220p. The second pre polycrystalline semiconductor layer 230p may have a second height 1123.

For example, the first pre polycrystalline semiconductor layer 130p may be formed at the same time as the second pre polycrystalline semiconductor layer 230p. For example, when there is a structure having a step on the substrate 100, pre polycrystalline semiconductor layers having different thicknesses from each other may be formed around the step.

For example, the first pre polycrystalline semiconductor layer 130p may be formed through a process different from that of the second pre polycrystalline semiconductor layer 230p.

Subsequently, a first pre gate mask 145p may be formed on the first pre polycrystalline semiconductor layer 130p. A second pre gate mask 245p may be formed on the second pre polycrystalline semiconductor electrode 230p.

A mask pattern MASK may be formed on the first pre gate mask 145p and the second pre gate mask 245p.

Figure 15:
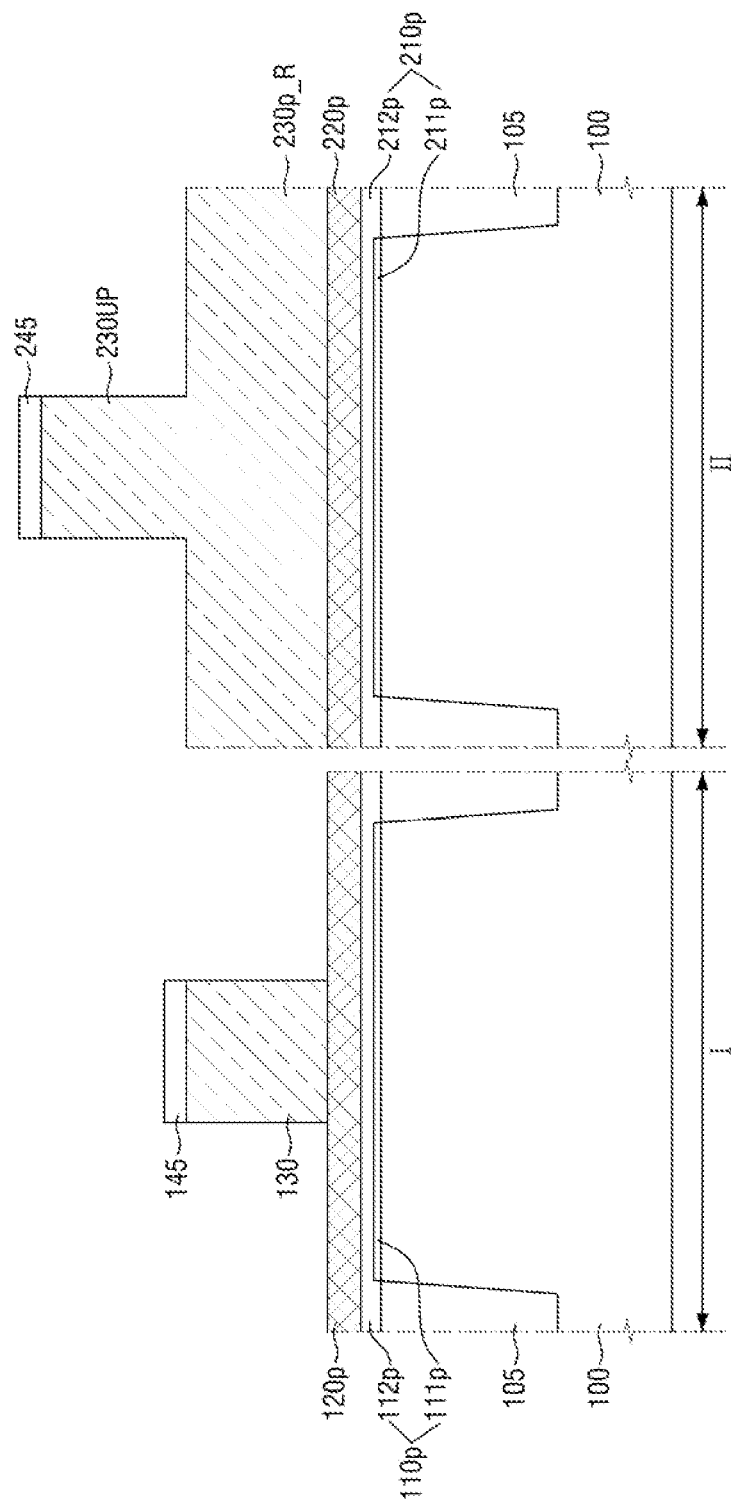

Referring to FIG. 15, by patterning the first pre gate mask 145p and the first pre polycrystalline semiconductor layer 130p, using the mask pattern MASK, a first gate mask pattern 145 and a first polycrystalline semiconductor electrode 130 may be formed in the first region I.

The first pre metallic gate electrode 120p is exposed, while the first polycrystalline semiconductor electrode 130 is formed.

When a part of the second pre gate mask 245p and the second pre polycrystalline semiconductor electrode 230p is patterned using the mask pattern MASK, the second gate mask pattern 245 and the upper part 230UP of the second polycrystalline semiconductor electrode 230 may be formed in the second region II.

After the upper part 230UP of the second polycrystalline semiconductor electrode 230 is formed, a rest 230p_R of the second polycrystalline semiconductor layer remains on the second pre metallic gate electrode 220p.

Some of the first pre polycrystalline semiconductor layer 130p and the second pre polycrystalline semiconductor electrode 230p are simultaneously patterned, and the first polycrystalline semiconductor electrode 130 and the upper part 230UP of the second polycrystalline semiconductor electrode 230 may be formed at the same time.

Figure 16:
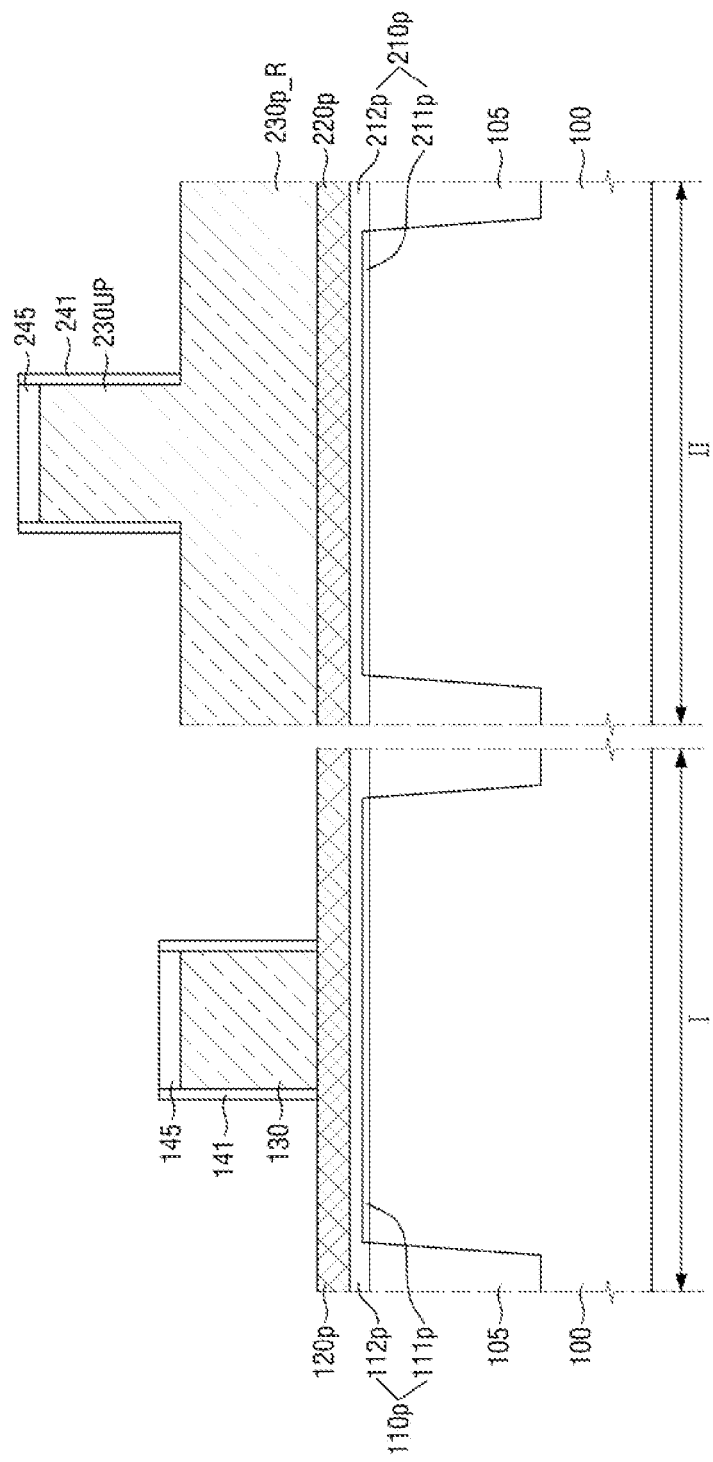

Subsequently, the mask pattern MASK may be removed.
Referring to FIG. 16, a first_1 spacer 141 may be formed on the side walls of the first polycrystalline semiconductor electrode 130.

A second_1 spacer 241 may be formed on the side walls of the upper part 230UP of the second polycrystalline semiconductor electrode 230.

For example, the first_1 spacer 141 and the second_1 spacer 241 may be formed at the same time. While the second_1 spacer 241 is formed, the first_1 spacer 141 is formed. The first_1 spacer 141 may be in contact with the first pre metallic gate electrode 120p.

Figure 17:
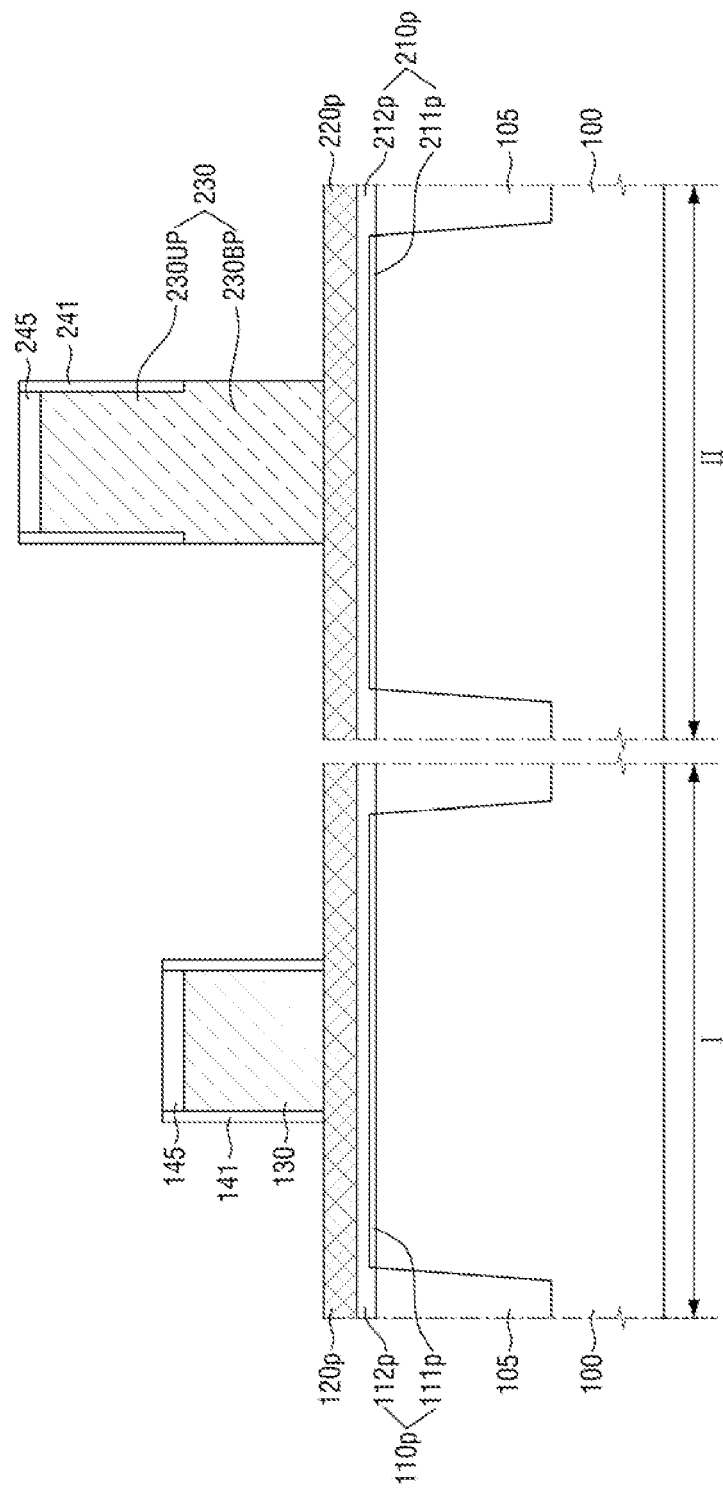

Referring to FIG. 17, a rest 230p_R of the second polycrystalline semiconductor layer may be patterned, using the upper part 230UP and the second_1 spacer 241 of the second polycrystalline semiconductor electrode 230 as an etching mask.

The lower part 230BP of the second polycrystalline semiconductor electrode 230 is formed through patterning of the rest 230p_R of the second polycrystalline semiconductor layer. Accordingly, the second polycrystalline semiconductor electrode 230 is formed on the second pre metallic gate electrode 220p.

Figure 18:
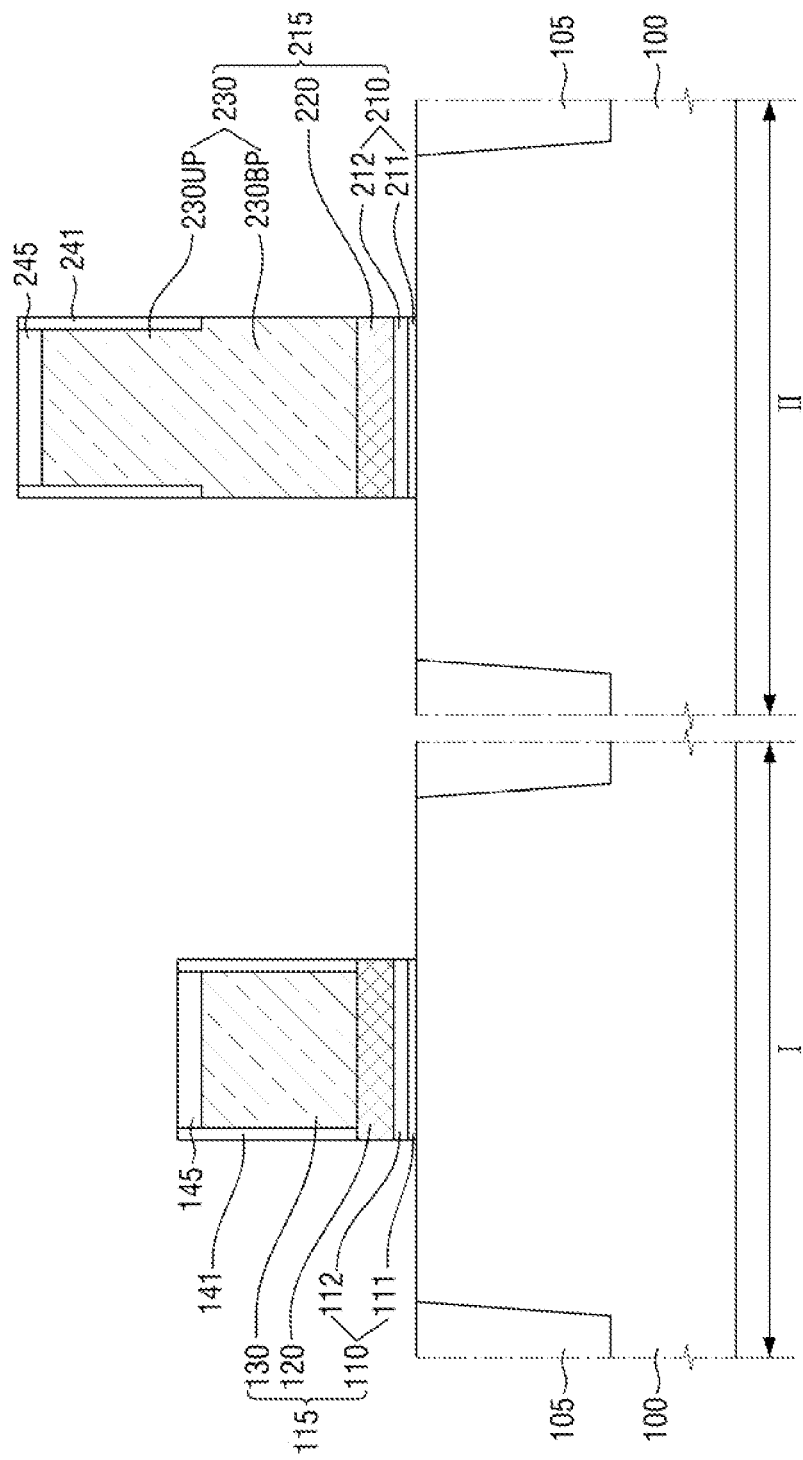

Referring to FIG. 18, the first pre metallic gate electrode 120p and the first pre gate insulating layer 110p may be patterned, using the first gate mask pattern 145, the first_1 spacer 141 and the first polycrystalline semiconductor electrode 130. Accordingly, the first metallic gate electrode 120 and the first gate insulating layer 110 are formed.

The second pre metallic gate electrode 220p and the second pre gate insulating layer 210p may be patterned, using the second gate mask pattern 245, the second_1 spacer 241 and the second polycrystalline semiconductor electrode 230. Accordingly, the second metallic gate electrode 220 and the second gate insulating layer 210 are formed.

The first gate electrode structure 115 is formed in the first region I, and the second gate electrode structure 215 is formed in the second region II.

Figure 19:
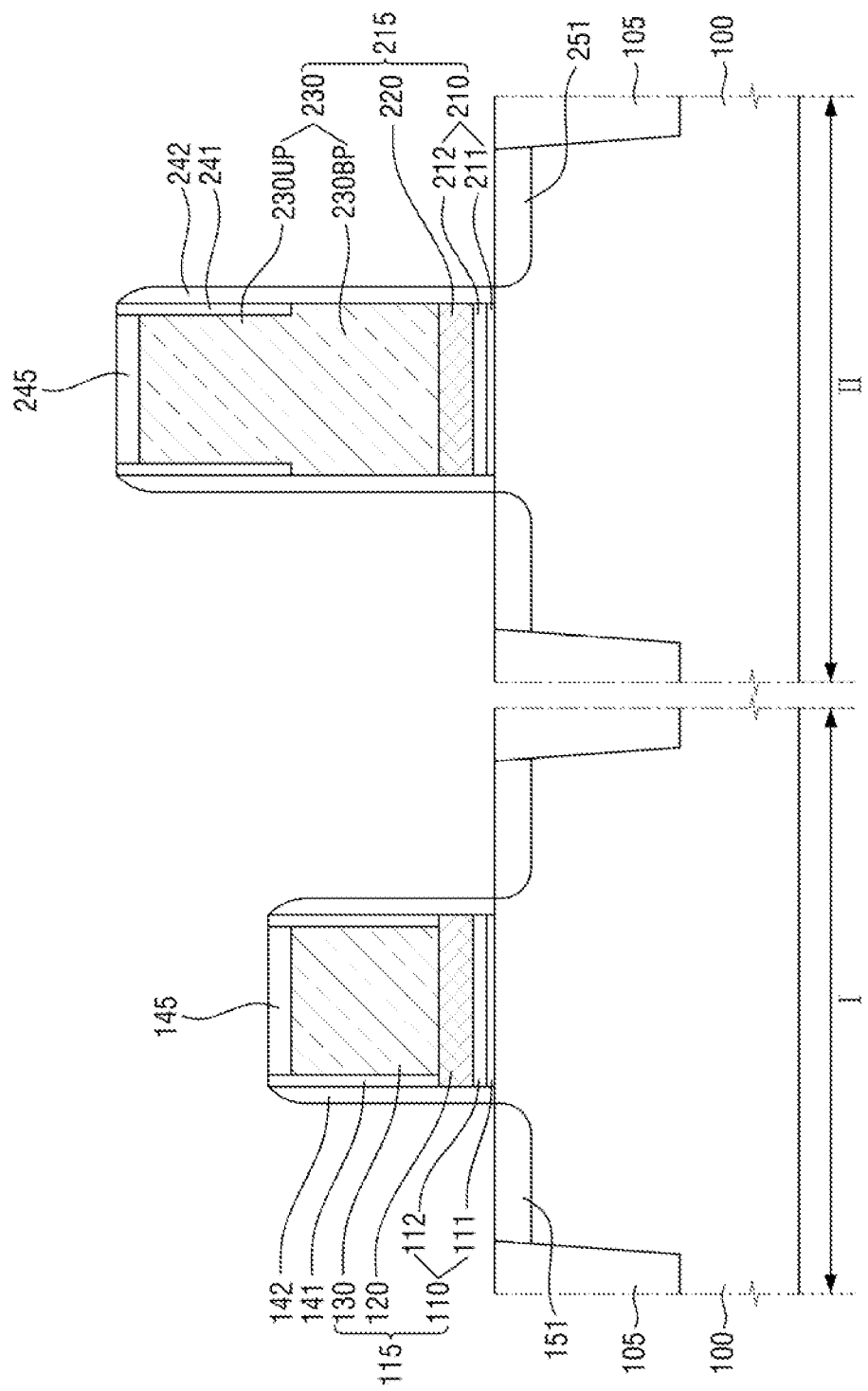

Referring to FIG. 19, the first_2 spacer 142 is formed on the side walls of the first gate electrode structure 115. The second_2 spacer 242 is formed on the side walls of the second gate electrode structure 215.

The first_2 spacer 142 is disposed on the first_1 spacer 141, and the second_2 spacer 242 is disposed on the second_1 spacer 241.

After forming the first_2 spacer 142 and the second_2 spacer 242, the first low-concentration impurity region 151 and the second low-concentration impurity region 251 may be formed in the substrate 100.

Figure 20:
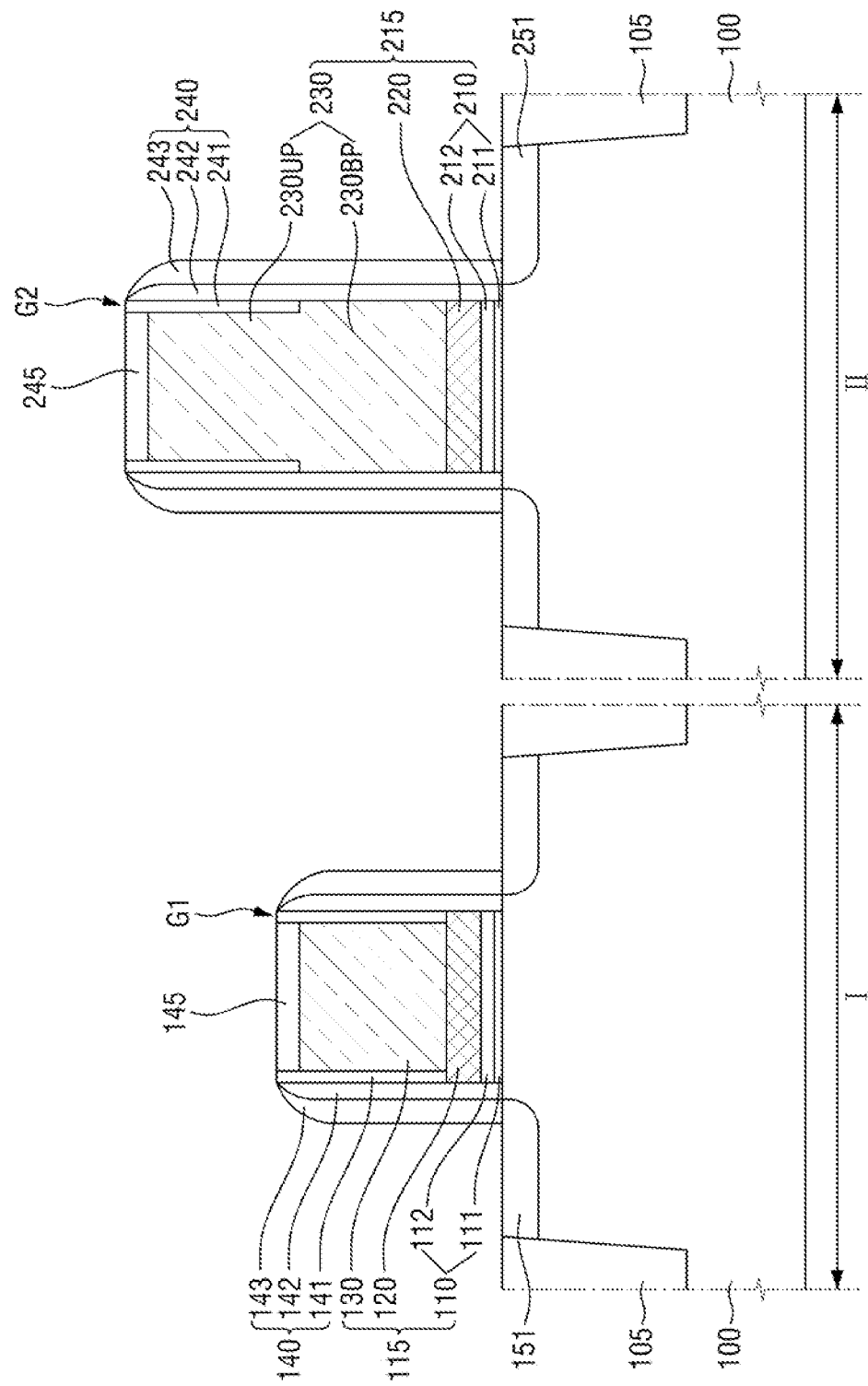

Referring to FIG. 20, by forming the first_3 spacer 143 on the first_2 spacer 142, the first spacer structure 140 may be formed.

By forming the second_3 spacer 243 on the second_2 spacer 242, the second spacer structure 240 may be formed.

Subsequently, the first high-concentration impurity region 152 and the second high-concentration impurity region 252 may be formed in the substrate 100.

In concluding the detailed description, those skilled in the art will appreciate that many variations and modifications can be made to the described embodiments without substantially departing from the principles of the present disclosure.

What is claimed is:

1. A semiconductor device, comprising:
a first gate electrode structure which includes a first gate insulating layer disposed on a substrate and a first gate electrode disposed on the first gate insulating layer;
a first spacer structure including a first spacer and a second spacer each disposed on side walls of the first gate electrode structure, the first spacer being disposed between the second spacer and the first gate electrode; and
a source/drain region disposed on opposite sides of the first gate electrode structure,
wherein the first gate electrode includes a lower part of the first gate electrode, an upper part of the first gate electrode disposed on the lower part of the first gate electrode,
wherein the first spacer is disposed on a side wall of the upper part of the first gate electrode and is omitted from a side wall of the lower part of the first gate electrode, and
wherein a width of the lower part of the first gate electrode is equal to a width of the upper part of the first gate electrode at a lowermost part of the first spacer.

2. The semiconductor device of claim 1, wherein the second spacer extends along the side wall of the upper part of the first gate electrode and the side wall of the lower part of the first gate electrode.

3. The semiconductor device of claim 1, further comprising:
a second gate electrode structure including a second gate insulating layer disposed on the substrate and a second gate electrode disposed on the second gate insulating layer; and
a second spacer structure having a same stacked layer structure as the first spacer structure, disposed on side walls of the second gate electrode structure,
wherein the second spacer structure includes a third spacer corresponding to the first spacer, and
wherein the third spacer extends along an entirety of the side walls of the second gate electrode.

4. The semiconductor device of claim 3, wherein the second gate electrode structure further includes a metal gate electrode disposed between the second gate electrode and the second gate insulating layer, and
wherein the third spacer is disposed on an upper face of the metal gate electrode.

5. The semiconductor device of claim 1, wherein the first spacer is in contact with the first gate electrode.

6. The semiconductor device of claim 1, wherein the first gate electrode structure further includes a metallic gate electrode disposed between the first gate electrode and the first gate insulating layer.

7. The semiconductor device of claim 1, wherein the first gate electrode includes a polycrystalline semiconductor material.

8. The semiconductor device of claim 1, wherein the first gate insulating layer includes a high-dielectric constant insulating layer, and
wherein the first gate insulating layer is omitted from the side walls of the first gate electrode.

9. The semiconductor device of claim 1, wherein the first spacer structure further includes a third spacer, and wherein the second spacer is disposed between the first spacer and the third spacer.

10. A semiconductor device, comprising:
a first gate electrode structure disposed in a first region of a substrate and including a first gate insulating layer and a first gate electrode disposed on the first gate insulating layer;
a first spacer in contact with the first gate electrode, disposed on side walls of the first gate electrode;
a second gate electrode structure disposed in a second region of the substrate and including a second gate insulating layer and a second gate electrode disposed on the second gate insulating layer;
a second spacer in contact with the second gate electrode, disposed on side walls of the second gate electrode;
wherein the first gate insulating layer includes a same material as the second gate insulating layer,
wherein a height from an upper face of the first gate insulating layer to a lowermost part of the first spacer is greater than a height from an upper face of the second gate insulating layer to a lowermost part of the second spacer,
wherein the first gate electrode includes a lower part of the first gate electrode, and an upper part of the first gate electrode disposed on the lower part of the first gate electrode, and
wherein a width of the lower part of the first gate electrode is equal to a width of the upper part of the first gate electrode at a lowermost part of the first spacer.

11. The semiconductor device of claim 10,
wherein the first spacer extends along side walls of the upper part of the first gate electrode, and
wherein the second spacer extends along an entirety of the side walls of the second gate electrode.

12. The semiconductor device of claim 11, wherein a height of the first gate electrode is greater than a height of the second gate electrode.

13. The semiconductor device of claim 10, wherein the first gate electrode structure includes a first metallic gate electrode disposed between the first gate insulating layer and the first gate electrode,
wherein the second gate electrode structure includes a second metallic gate electrode disposed between the second gate insulating layer and the second gate electrode, and
wherein each of the first gate electrode and the second gate electrode includes polysilicon.

14. The semiconductor device of claim 13, further comprising:
a third spacer covering side walls of the metallic portion of the first gate electrode, on the first spacer; and
a fourth spacer covering side walls of the metallic portion of the second gate electrode, on the second spacer.

15. A semiconductor device, comprising:
a first gate electrode structure disposed in a first region of a substrate, and including a first gate insulating layer, a first metallic gate electrode, and a first polysilicon electrode sequentially stacked on the substrate;
a first spacer structure including a first spacer and a second spacer on side walls of the first gate electrode structure, the first spacer being disposed between the second spacer and the first polysilicon electrode and spaced apart from an upper face of the first metallic gate electrode;
a second gate electrode structure disposed in a second region of the substrate, and including a second gate insulating layer, a second metallic gate electrode, and a second polysilicon electrode sequentially stacked on the substrate; and a second spacer structure including a third spacer and a fourth spacer disposed on side walls of the second gate electrode structure, the third spacer being disposed between the fourth spacer and the second polysilicon electrode and being in contact with an upper face of the second metallic gate electrode, wherein a height of the first gate electrode structure is greater than a height of the second gate electrode structure, and wherein a width of the first metallic gate electrode is equal to a width of the first polysilicon electrode at a lowermost part of the first spacer.

16. The semiconductor device of claim 15, wherein a height of the first polysilicon electrode is greater than a height of the second polysilicon electrode.

17. The semiconductor device of claim 15, wherein the second spacer covers the side walls of the first metallic gate electrode, and wherein the fourth spacer covers the side walls of the second metallic gate electrode.

* * * * *